(12) United States Patent
Loseu et al.

(10) Patent No.: US 8,134,426 B1
(45) Date of Patent: Mar. 13, 2012

(54) TWO-TRACK SURFACE ACOUSTIC WAVE STRUCTURE WITHOUT INTERNAL PADS

(75) Inventors: Aleh Loseu, Greensboro, NC (US); Jayanti Jaganatha Rao, Jamestown, NC (US)

(73) Assignee: RF Micro Devices, Inc., Greensboro, NC (US)

( * ) Notice: Subject to any disclaimer, the term of this patent is extended or adjusted under 35 U.S.C. 154(b) by 279 days.

(21) Appl. No.: 12/628,579

(22) Filed: Dec. 1, 2009

Related U.S. Application Data

(60) Provisional application No. 61/118,784, filed on Dec. 1, 2008.

(51) Int. Cl.
*H03H 9/64* (2006.01)
*H01L 41/04* (2006.01)

(52) U.S. Cl. .................. 333/195; 333/193; 310/313 D

(58) Field of Classification Search .................. 333/193, 333/195; 310/313 R, 313 B, 313 D
See application file for complete search history.

(56) References Cited

U.S. PATENT DOCUMENTS

| | | | |
|---|---|---|---|
| 6,163,236 A * | 12/2000 | Thomas | 333/195 |
| 6,420,946 B1 | 7/2002 | Bauer et al. | |
| 6,501,208 B1 * | 12/2002 | Kuroda | 310/313 R |
| 6,798,318 B1 * | 9/2004 | Abbott et al. | 333/195 |
| 6,861,927 B1 * | 3/2005 | Abbott et al. | 333/195 |
| 7,102,468 B2 * | 9/2006 | Otsuka et al. | 333/195 |
| 2003/0160665 A1 | 8/2003 | Hagn et al. | |

OTHER PUBLICATIONS

Morita, Takao, "Wideband Low Loss Double Mode SAW Filters," Proceedings of IEEE 1992 Ultrasonics Symposium, Oct. 20-23, 1992, pp. 95-104, vol. 1, IEEE.

* cited by examiner

*Primary Examiner* — Dean O Takaoka
(74) *Attorney, Agent, or Firm* — Withrow & Terranova, P.L.L.C.

(57) ABSTRACT

The present disclosure relates to a two-track surface acoustic wave (SAW) device that has a reduced size compared to a traditional two-track SAW device by eliminating an internal ground connection node of the traditional two-track SAW device. The internal ground connection node is eliminated by coupling an internal ground interconnection to an external ground connection node through an interconnecting ground grating, which is part of one of two SAW tracks of the two-track SAW device. The internal ground interconnection is located in an internal region of the two-track SAW device that is defined by the two SAW tracks and by two electrical interconnections between the two SAW tracks.

26 Claims, 21 Drawing Sheets

TWO-TRACK SURFACE ACOUSTIC WAVE STRUCTURE WITHOUT INTERNAL PADS

This application claims the benefit of provisional patent application Ser. No. 61/118,784, filed Dec. 1, 2008, the disclosure of which is hereby incorporated herein by reference in its entirety.

FIELD OF THE DISCLOSURE

Embodiments of the present disclosure relate to surface acoustic wave (SAW) devices, particularly SAW filters, which may be used in radio frequency (RF) communications systems.

BACKGROUND OF THE DISCLOSURE

As technology progresses, wireless devices tend to integrate more features and become increasingly ubiquitous. For example, wireless devices may include features associated with personal digital assistants (PDAs), cellular telephones, wireless internet access devices, global positioning system (GPS) receivers, and the like. Therefore, multiple radio frequency (RF) signals spanning a wide frequency range are common in many areas and may interfere with one another. Wireless devices may support one or more wireless communications protocols, such as third (3G), fourth (4G), or later generation cellular telephone protocols, GPS protocols, wireless fidelity (Wi-Fi) protocols, Bluetooth®, and the like. Some of these protocols may have tight channel spacings that require narrow channel bandwidths. Therefore, wireless devices using specified channel bandwidths may need RF filters that have required passbands to accept desirable signals and have maximum broadband rejection to remove interfering signals.

Surface acoustic wave (SAW) devices are electro-mechanical devices that utilize surface acoustic waves, which travel along the surface of a substrate having some elasticity. The substrate has a relationship between an electrical signal and mechanical movement within the substrate. An applied electrical signal may be used to cause the mechanical movement, which may include surface acoustic waves, or the mechanical movement may be used to provide an electrical signal. Therefore, the substrate may be used as a transducer for transduction between an electrical signal and mechanical movement. An inter-digital transducer (IDT) is a special type of transducer used to convert an electrical signal into surface acoustic waves or to convert surface acoustic waves into an electrical signal.

A SAW track may include two or more IDTs along an acoustic cavity, such that the IDTs are acoustically coupled to one another. A first IDT in the SAW track may receive an input signal and a second IDT in the SAW track may provide an output signal based on surface acoustic waves that are coupled between the IDTs. Multiple SAW tracks may be electrically coupled to one another to form a SAW device, such as a SAW filter. A SAW filter may be used in some RF applications to provide a required passband and good broadband rejection. Manufacturing costs of a SAW device may be directly related to the size of the SAW device, which is related to the sizes and spacings of IDTs used in the SAW device. Such sizes and spacings may be related to frequencies of surface acoustic waves in the SAW device. To preserve signal integrity in RF applications, a SAW device may need to have minimal insertion loss. Thus, there is a need for a SAW device having a small size, minimal insertion loss, a required passband, and maximum broadband rejection.

SUMMARY OF THE EMBODIMENTS

The present disclosure relates to a two-track surface acoustic wave (SAW) device that has a reduced size compared to a traditional two-track SAW device by eliminating an internal ground connection node of the traditional two-track SAW device. The internal ground connection node is eliminated by coupling an internal ground interconnection to an external ground connection node through an interconnecting ground grating, which is part of one of two SAW tracks of the two-track SAW device. The internal ground interconnection is located in an internal region of the two-track SAW device that is defined by the two SAW tracks and by two electrical interconnections between the two SAW tracks.

By eliminating the internal ground connection node, the two electrical interconnections between the two SAW tracks can be shortened, thereby reducing the length of the two-track SAW device. Further, the addition of the interconnecting ground grating may function as an additional reflecting element, thereby improving electrical matching between the two SAW tracks. As such, an insertion loss of the two-track SAW device may be reduced, a frequency response of the two-track SAW device may have steeper slopes, thereby providing better passband performance and near band rejection, the two-track SAW device may have better wideband rejection, the two-track SAW device may have improved return loss, or any combination thereof.

In one embodiment of the two-track SAW device, one SAW track has three inter-digital transducers (IDTs) and the other SAW track has four IDTs. The three IDT SAW track may provide a single-ended input and the four IDT SAW track may provide a differential output. Conversely, the four IDT SAW track may provide a differential input and the three IDT SAW track may provide a single-ended output. In an alternate embodiment of the two-track SAW device, both SAW tracks have four IDTs. One four IDT SAW track may provide a differential input and the other four IDT SAW track may provide a differential output. The internal ground interconnection is coupled to a first external ground connection node through a first interconnecting ground grating in one of the four IDT SAW tracks. The internal ground interconnection may be further grounded by coupling to a second external ground connection node through a second interconnecting ground grating in the other of the four IDT SAW tracks. Gratings at the ends of either or both of the SAW tracks may be left floating or electrically coupled to external ground connection nodes. In an additional embodiment of the two-track SAW device, one SAW track may have more than three IDTs and the other SAW track may have more than four IDTs. In one embodiment of the two-track SAW device, the two-track SAW device is a two-track SAW filter. The two-track SAW filter may be used in a SAW duplexer.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION OF THE PREFERRED EMBODIMENTS

Figure 1:
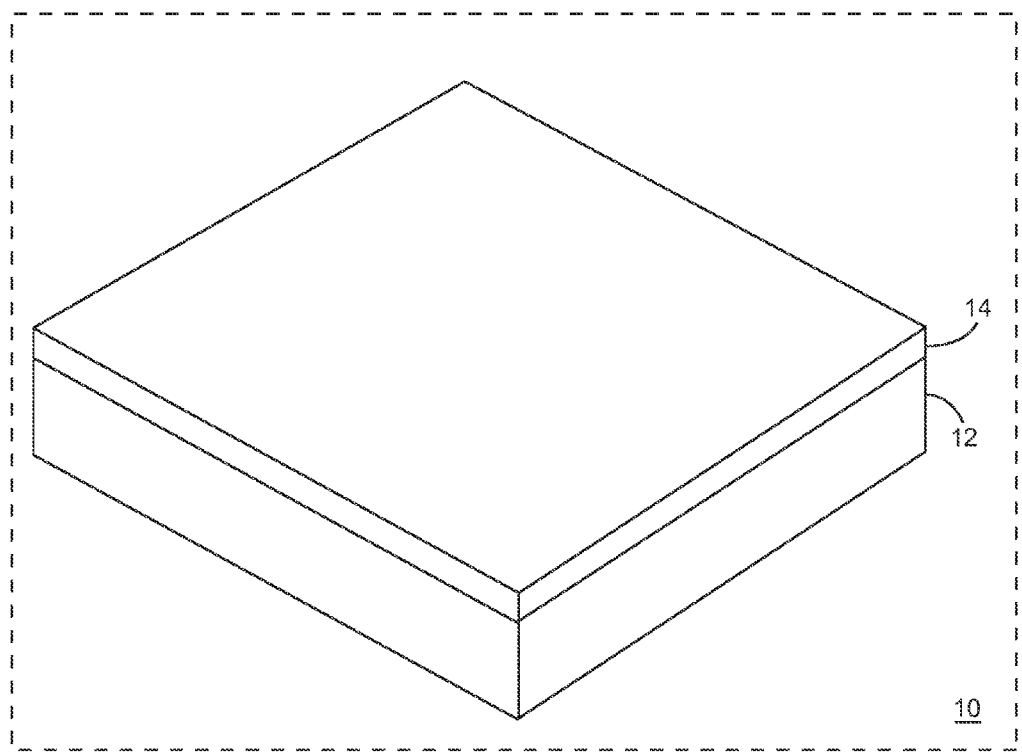
FIG. 1 shows an isometric view of a piezoelectric wafer that may be suitable for fabricating surface acoustic wave (SAW) devices according to the prior art.

The embodiments set forth below represent the necessary information to enable those skilled in the art to practice the disclosure and illustrate the best mode of practicing the disclosure. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

The present disclosure relates to a two-track surface acoustic wave (SAW) device that has a reduced size compared to a traditional two-track SAW device by eliminating an internal ground connection node of the traditional two-track SAW device. The internal ground connection node is eliminated by coupling an internal ground interconnection to an external ground connection node through an interconnecting ground grating, which is part of one of two SAW tracks of the two-track SAW device. The internal ground interconnection is located in an internal region of the two-track SAW device that is defined by the two SAW tracks and by two electrical interconnections between the two SAW tracks.

By eliminating the internal ground connection node, the two electrical interconnections between the two SAW tracks can be shortened, thereby reducing the length of the two-track SAW device. Further, the addition of the interconnecting ground grating may function as an additional reflecting element, thereby improving electrical matching between the two SAW tracks. As such, an insertion loss of the two-track SAW device may be reduced, a frequency response of the two-track SAW device may have steeper slopes, thereby providing better passband performance and near band rejection, the two-track SAW device may have better wideband rejection, the two-track SAW device may have improved return loss, or any combination thereof.

In one embodiment of the two-track SAW device, one SAW track has three inter-digital transducers (IDTs) and the other SAW track has four IDTs. The three IDT SAW track may provide a single-ended input and the four IDT SAW track may provide a differential output. Conversely, the four IDT SAW track may provide a differential input and the three IDT SAW track may provide a single-ended output. In an alternate embodiment of the two-track SAW device, both SAW tracks have four IDTs. One four IDT SAW track may provide a differential input and the other four IDT SAW track may provide a differential output. The internal ground interconnection is coupled to a first external ground connection node through a first interconnecting ground grating in one of the four IDT SAW tracks. The internal ground interconnection may be further grounded by coupling to a second external ground connection node through a second interconnecting ground grating in the other of the four IDT SAW tracks. Gratings at the ends of either or both of the SAW tracks may be left floating or electrically coupled to external ground connection nodes. In an additional embodiment of the two-track SAW device, one SAW track may have more than three IDTs and the other SAW track may have more than four IDTs. In one embodiment of the two-track SAW device, the two-track SAW device is a two-track SAW filter. The two-track SAW filter may be used in a SAW duplexer.

FIG. 1 shows an isometric view of a piezoelectric wafer 10 that may be suitable for fabricating SAW devices according to the prior art. A substrate 12 provides material upon which SAW devices are formed. A conductive layer 14 is over the substrate 12 and is patterned to provide electrical connections and conductive elements of the SAW devices.

Figure 2:
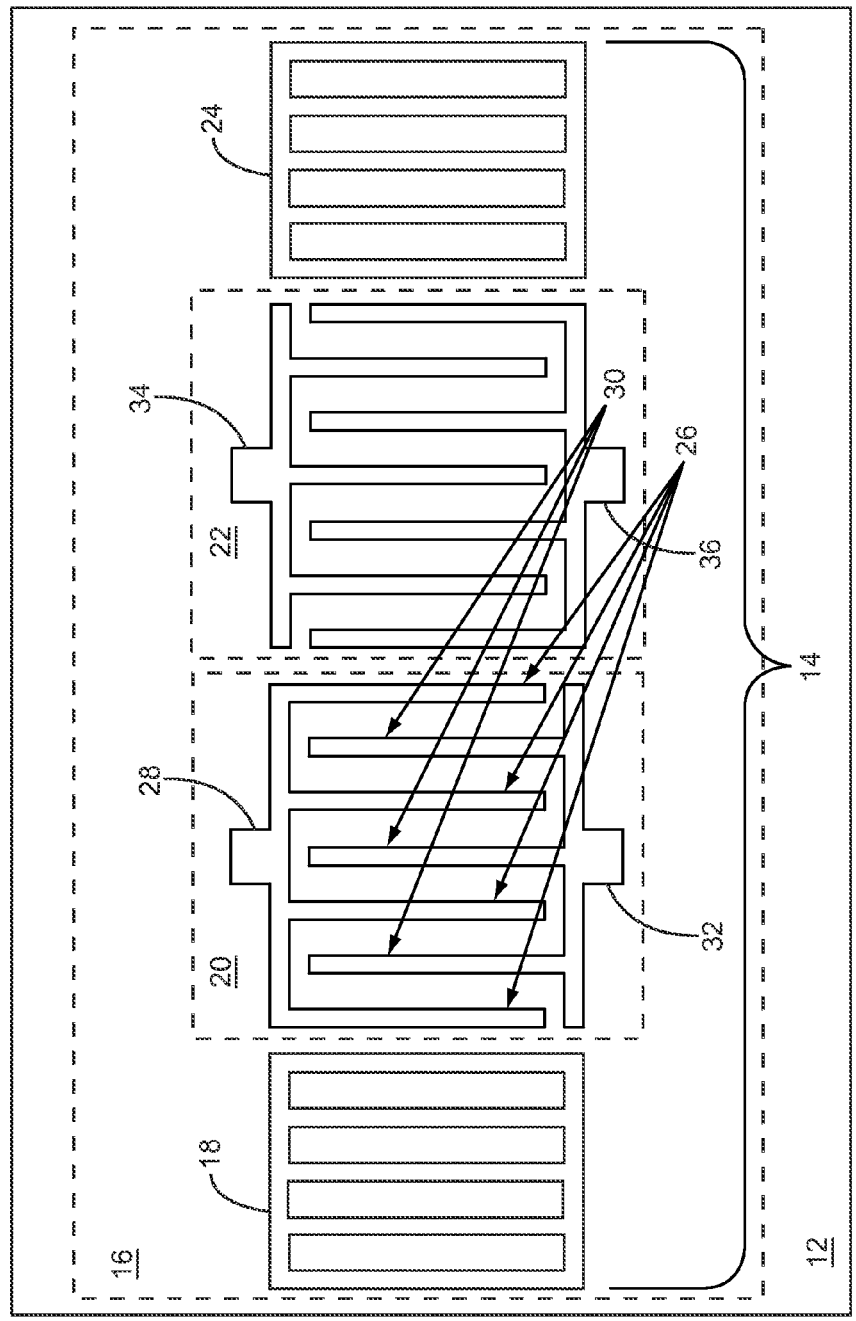
FIG. 2 shows a top-view of the substrate of the piezoelectric wafer illustrated in FIG. 1 according to the prior art.

FIG. 2 shows a top-view of the conductive layer 14 over the substrate 12, such that parts of the conductive layer 14 are removed to form a single-track SAW device 16, according to the prior art. The single-track SAW device 16 includes a first grating 18, a first IDT 20 adjacent to the first grating 18, a second IDT 22 adjacent to the first IDT 20, and a second grating 24 adjacent to the second IDT 22. The first IDT 20 has a first set of inter-digitated fingers (IDFs) 26 electrically coupled to a first connection node (FCN) 28 and a second set of IDFs 30 electrically coupled to a second connection node (SCN) 32. The first set of IDFs 26 are interlaced with, electrically isolated from, and acoustically coupled to the second set of IDFs 30.

The first and the second sets of IDFs 26, 30 over the substrate 12 form the first IDT 20, such that an electrical signal applied between the FCN 28 and the SCN 32 may generate surface acoustic waves in the substrate 12. Likewise, surface acoustic waves in the substrate 12 may generate an electrical signal between the FCN 28 and the SCN 32. Similar to the first IDT 20, the second IDT 22 has two sets of IDFs electrically coupled to a third connection node (TCN) 34 and a fourth connection node (4CN) 36. The first and the second gratings 18, 24 may include multiple grating fingers that are about parallel to the IDFs of the first and the second IDTs 20, 22.

Figures 3A, 3B:
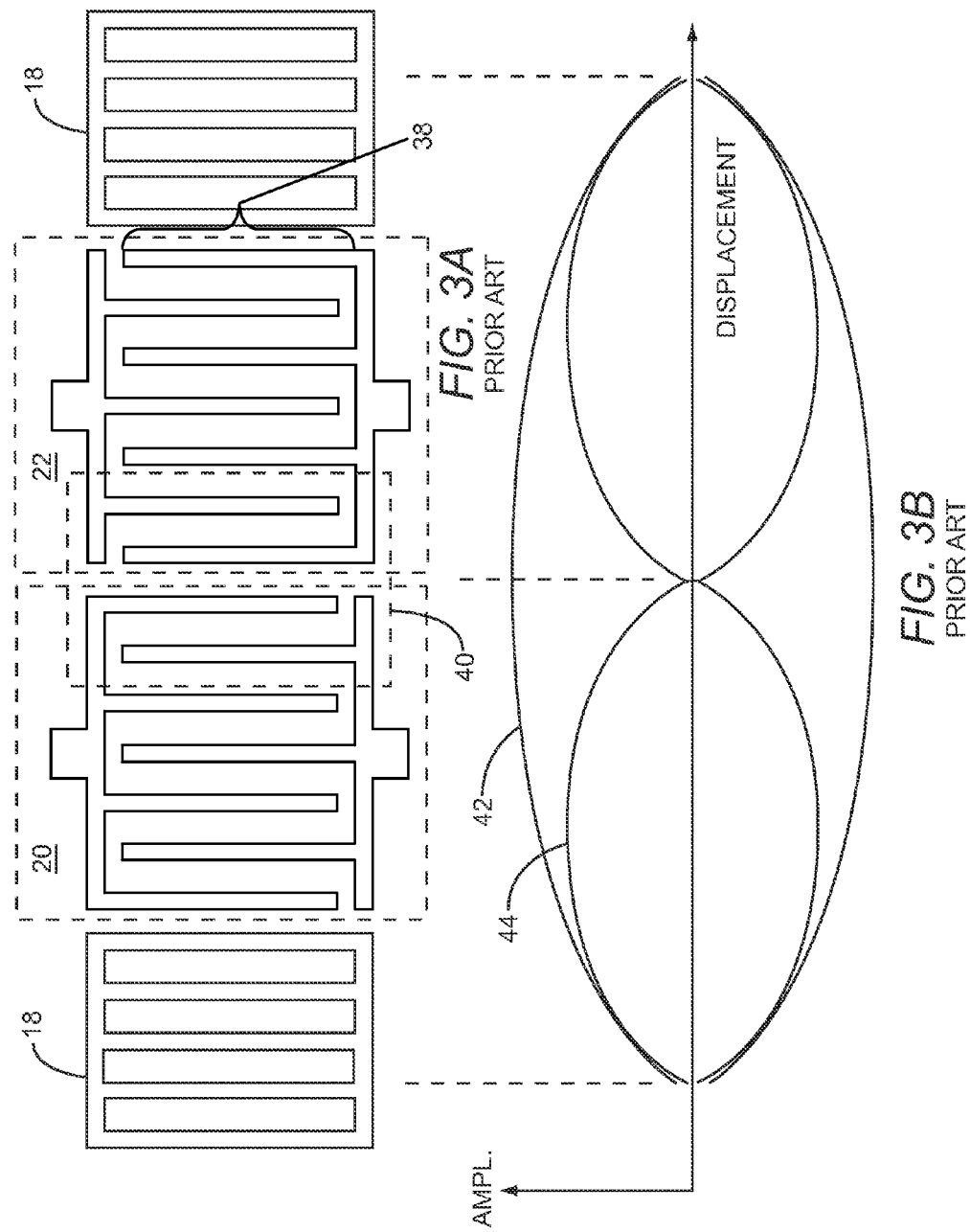
FIG. 3A shows dual-mode SAW coupling between a first inter-digital transducer (IDT) and a second IDT illustrated in FIG. 2 according to the prior art.
FIG. 3B is a graph showing a first mode and a second mode of a single-track SAW device illustrated in FIG. 3A according to the prior art.

The single-track SAW device 16 illustrated in FIG. 2 may function as a dual-mode SAW device (DMSD) as illustrated in FIGS. 3A and 3B. FIG. 3A shows dual-mode SAW coupling between the first IDT 20 and the second IDT 22 illustrated in FIG. 2 according to the prior art. Each IDF of the first and the second IDTs 20, 22 has a finger length 38 that determines a width of an acoustic aperture of the single-track SAW device 16. An input impedance of the first IDT 20 at frequencies in a passband of the single-track SAW device 16 is inversely related to the width of the acoustic aperture. To achieve a low input impedance, as required in some RF communications systems, a wide acoustic aperture is required, which requires long finger lengths 38. However, increasing finger lengths 38 increases insertion loss; therefore, architectures that reduce insertion loss while providing a low input impedance may be desirable. The single-track SAW device 16 operating as a DMSD relies on dual-mode SAW coupling between the first and the second IDTs 20, 22. A chirping region 40 overlaps the first and the second IDTs 20, 22 and provides the appropriate SAW coupling. In the chirping region 40, the widths of individual fingers, the spacing between fingers, or both may vary to provide SAW coupling that varies with frequency, thereby providing a desired frequency response of the single-track SAW device 16. The first and the second gratings 18, 24 substantially contain surface acoustic wave propagation within the single-track SAW device 16.

FIG. 3B is a graph showing a first mode and a second mode of the single-track SAW device 16 illustrated in FIG. 3A according to the prior art. The first mode is a symmetric mode having a symmetric mode response 42 that has an amplitude peak at the center of the chirping region 40. The second mode is an anti-symmetric mode having an anti-symmetric mode response 44 that has an amplitude valley at the center of the chirping region 40.

Figure 4:
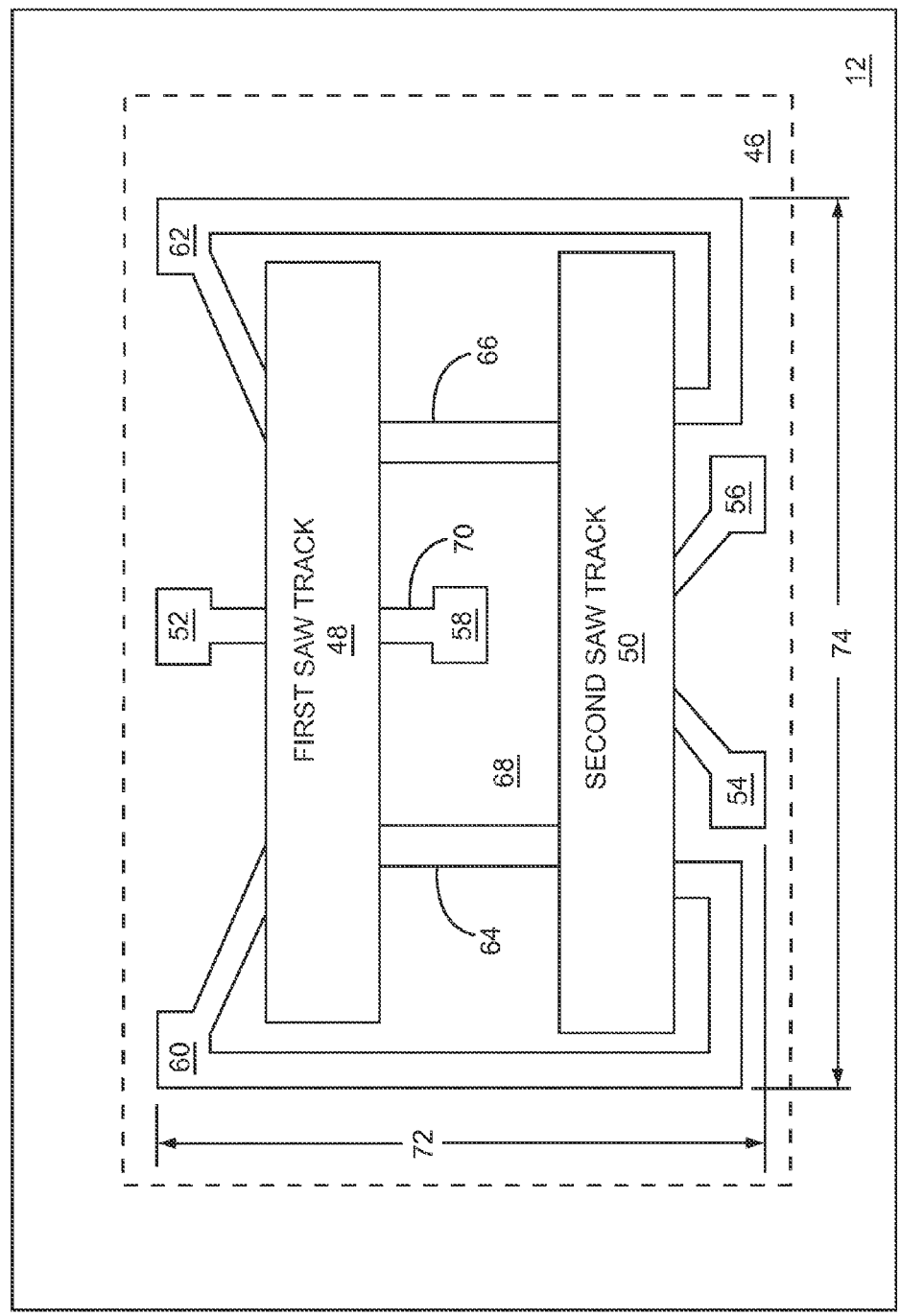
FIG. 4 shows a top-view of an internal ground connection node two-track SAW device according to the prior art.

FIG. 4 shows a top-view of an internal ground connection node two-track SAW device 46 according to the prior art. The internal ground connection node two-track SAW device 46 includes a first SAW track 48 disposed on the substrate 12, a second SAW track 50 disposed on the substrate 12, a first connection node 52 disposed on the substrate 12 and electrically coupled to the first SAW track 48, a second connection node 54 disposed on the substrate 12 and electrically coupled to the second SAW track 50, a third connection node 56 disposed on the substrate 12 and electrically coupled to the second SAW track 50, an internal ground connection node 58 disposed on the substrate 12, a first ground connection node 60 disposed on the substrate 12 and electrically coupled to the first and the second SAW tracks 48, 50, a second ground connection node 62 disposed on the substrate 12 and electrically coupled to the first and the second SAW tracks 48, 50, a first electrical interconnection 64 disposed on the substrate 12 and electrically coupled between the first and the second SAW tracks 48, 50, a second electrical interconnection 66 disposed on the substrate 12 and electrically coupled between the first and the second SAW tracks 48, 50, an internal region 68 defined by the first and the second SAW tracks 48, 50 and the first and the second electrical interconnections 64, 66, and an internal ground interconnection 70 disposed on the substrate 12 and electrically coupled between the internal ground connection node 58 and the first SAW track 48. The internal ground interconnection 70 and the internal ground connection node 58 are both located in the internal region 68. The internal ground connection node two-track SAW device 46 has a SAW device length 72 and a SAW device width 74. Either the first SAW track 48, the second SAW track 50, or both may function as a dual-mode SAW track. Either the first SAW track 48, the second SAW track 50, or both may function as a multi-mode SAW track. As such, the internal ground connection node two-track SAW device 46 may function as a DMSD or a multi-mode SAW device (MMSD).

Figure 5:
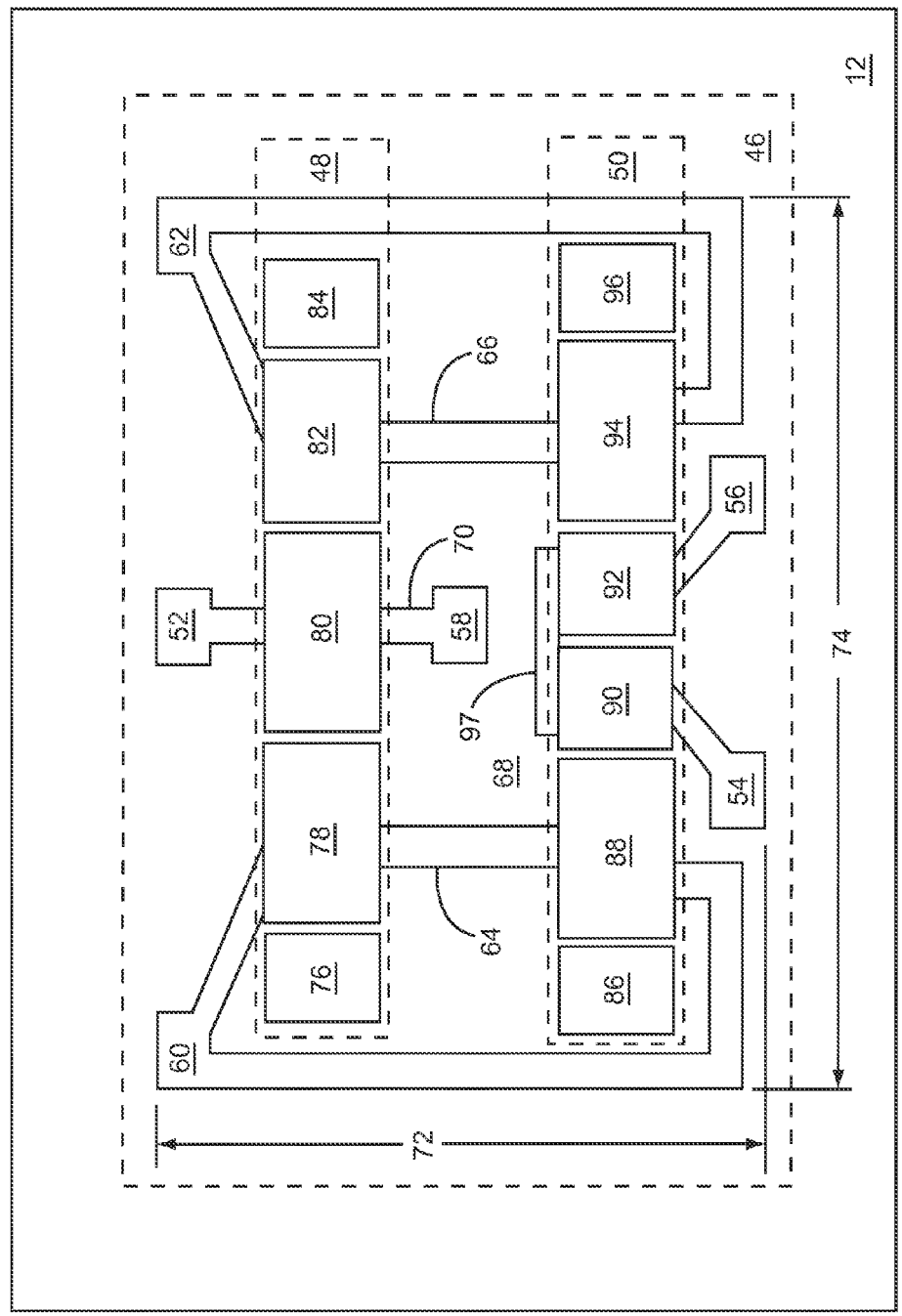
FIG. 5 shows a top-view of details of the internal ground connection node two-track SAW device illustrated in FIG. 4 according to the prior art.

FIG. 5 shows a top-view of details of the internal ground connection node two-track SAW device 46 illustrated in FIG. 4 according to the prior art. The first SAW track 48 includes a first grating 76, a first IDT 78 adjacent to the first grating 76, a second IDT 80 adjacent to the first IDT 78, a third IDT 82 adjacent to the second IDT 80, and a second grating 84 adjacent to the third IDT 82. The second SAW track 50 includes a third grating 86, a fourth IDT 88 adjacent to the third grating 86, a fifth IDT 90 adjacent to the fourth IDT 88, a sixth IDT 92 adjacent to the fifth IDT 90, a seventh IDT 94 adjacent to the sixth IDT 92, and a fourth grating 96 adjacent to the seventh IDT 94. The first, the second, the third, and the fourth gratings 76, 84, 86, 96 may be left floating. Grounding IDFs 136 (FIG. 19) of the first IDT 78 may be electrically coupled to the first ground connection node 60. Active IDFs 134 (FIG. 19) of the first IDT 78 may be electrically coupled to active IDFs 134 (FIG. 19) of the fourth IDT 88 through the first electrical interconnection 64. Grounding IDFs 136 (FIG. 19) of the fourth IDT 88 may be electrically coupled to the first ground connection node 60. Grounding IDFs 136 (FIG. 19) of the second IDT 80 may be electrically coupled to the internal ground connection node 58 through the internal ground interconnection 70. Active IDFs 134 (FIG. 19) of the second IDT 80 may be electrically coupled to the first connection node 52.

Grounding IDFs 136 (FIG. 19) of the third IDT 82 may be electrically coupled to the second ground connection node 62. Active IDFs 134 (FIG. 19) of the third IDT 82 may be electrically coupled to active IDFs 134 (FIG. 19) of the seventh IDT 94 through the second electrical interconnection 66. Grounding IDFs 136 (FIG. 19) of the seventh IDT 94 may be electrically coupled to the second ground connection node 62. Active IDFs 134 (FIG. 19) of the fifth IDT 90 may be electrically coupled to the second connection node 54. Active IDFs 134 (FIG. 19) of the sixth IDT 92 may be electrically coupled to the third connection node 56. The internal ground connection node two-track SAW device 46 may further include a third electrical interconnection 97 disposed on the substrate 12. Grounding IDFs 136 (FIG. 19) of the fifth IDT 90 may be electrically coupled to grounding IDFs 136 (FIG. 19) of the sixth IDT 92 through the third electrical interconnection 97 to provide a signal path between the second and the third connection nodes 54, 56.

Figure 6:
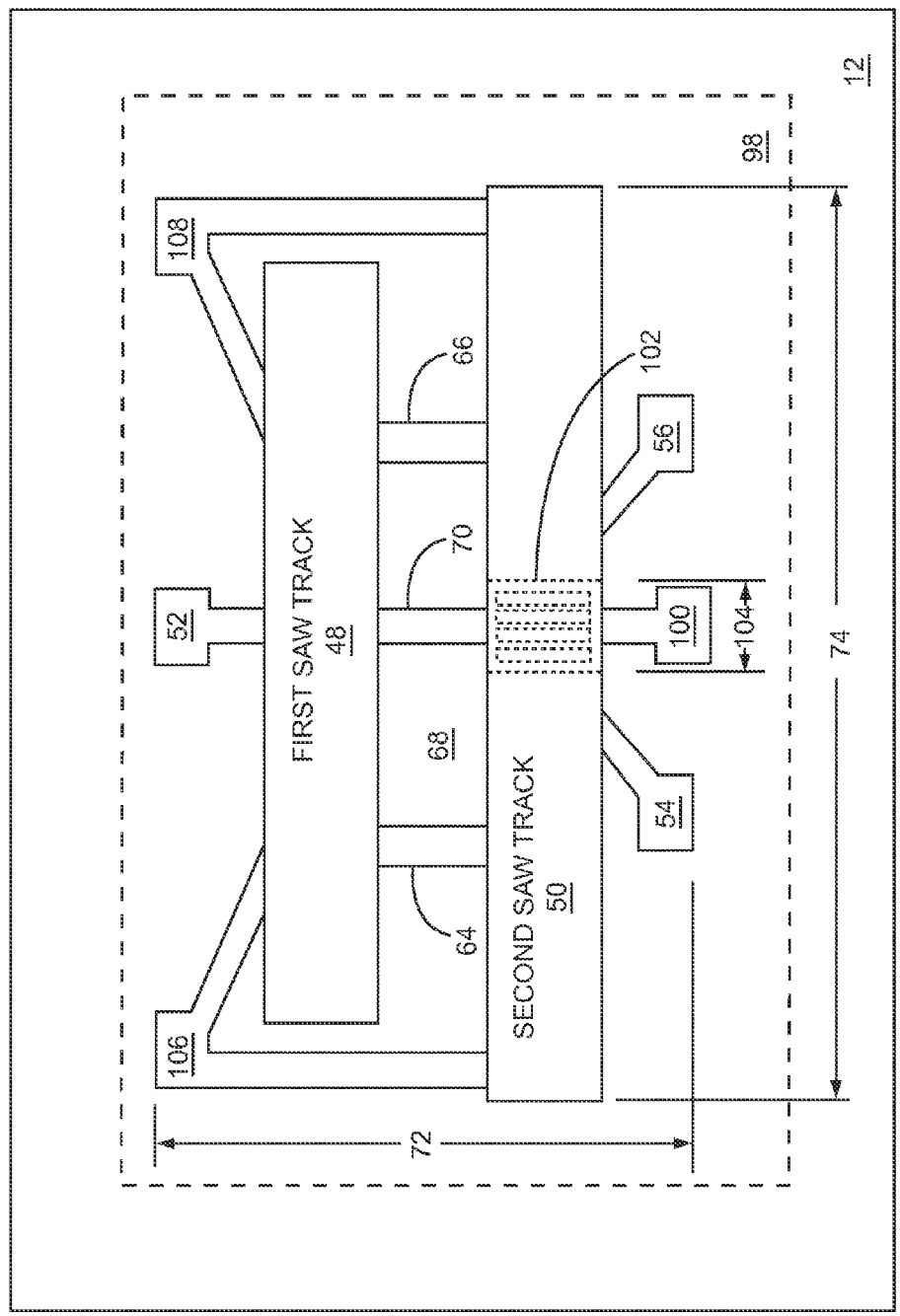
FIG. 6 shows a top-view of a two-track SAW device according to one embodiment of the present disclosure.

FIG. 6 shows a top-view of a two-track SAW device 98 according to one embodiment of the present disclosure. The two-track SAW device 98 includes the substrate 12, a first external ground connection node 100 disposed on the substrate 12, the first SAW track 48 disposed on the substrate 12, the second SAW track 50 disposed on the substrate 12 and including a first interconnecting ground grating 102 having an interconnecting ground grating length 104, the first connection node 52 disposed on the substrate 12 and electrically coupled to the first SAW track 48, the second connection node 54 disposed on the substrate 12 and electrically coupled to the second SAW track 50, the third connection node 56 disposed on the substrate 12 and electrically coupled to the second SAW track 50, a second external ground connection node 106 disposed on the substrate 12 and electrically coupled to the first and the second SAW tracks 48, 50, a third external ground connection node 108 disposed on the substrate 12 and electrically coupled to the first and the second SAW tracks 48, 50, the first electrical interconnection 64 disposed on the substrate 12 and electrically coupled between the first and the second SAW tracks 48, 50, the second electrical interconnection 66 disposed on the substrate 12 and electrically coupled between the first and the second SAW tracks 48, 50, the internal region 68 defined by the first and the second SAW tracks 48, 50 and the first and the second electrical interconnections 64, 66, and the internal ground interconnection 70 disposed on the substrate 12 and electrically coupled to the first SAW track 48.

The internal ground interconnection 70 is located in the internal region 68 and is electrically coupled to the first external ground connection node 100 through the first interconnecting ground grating 102. In a first exemplary embodiment of the present disclosure, the internal ground interconnection 70 is electrically connected to the first external ground connection node 100 through the first interconnecting ground grating 102. In a second exemplary embodiment of the present disclosure, the internal region 68 has no ground connection nodes, particularly the internal ground connection node 58. The two-track SAW device 98 has a SAW device length 72 and a SAW device width 74. Either the first SAW track 48, the second SAW track 50, or both may function as a dual-mode SAW track. Either the first SAW track 48, the second SAW track 50, or both may function as a multi-mode SAW track. As such, the two-track SAW device 98 may function as a DMSD or a MMSD. By eliminating the internal ground connection node 58 (FIG. 4), the SAW device length 72 of the two-track SAW device 98 illustrated in FIG. 6 may be significantly less than the SAW device length 72 of the internal ground connection node two-track SAW device illustrated 46 in FIG. 4. In a first exemplary embodiment of the first interconnecting ground grating 102 the interconnecting ground grating length 104 is greater than one wavelength of a surface acoustic wave of the two-track SAW device 98. In a second exemplary embodiment of the first interconnecting ground grating 102 the interconnecting ground grating length 104 is greater than ten wavelengths of the surface acoustic wave of the two-track SAW device 98. In a third exemplary embodiment of the first interconnecting ground grating 102 the interconnecting ground grating length 104 is greater than twenty wavelengths of the surface acoustic wave of the two-track SAW device 98.

Figure 7:
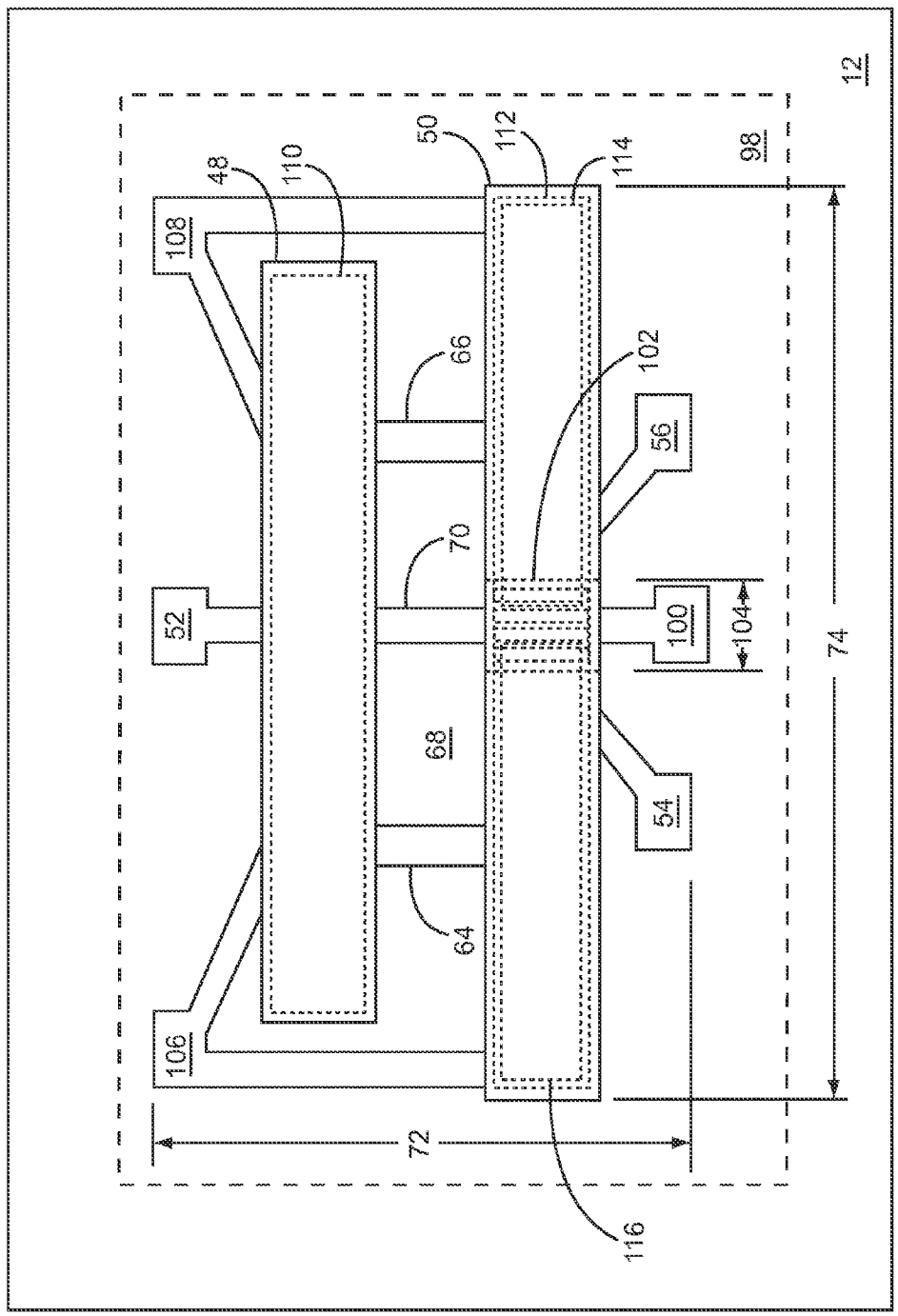
FIG. 7 shows details of a first SAW track and a second SAW track illustrated in FIG. 6 according to one embodiment of the first SAW track and one embodiment of the second SAW track, respectively.

FIG. 7 shows details of the first SAW track 48 and the second SAW track 50 illustrated in FIG. 6 according to one embodiment of the first SAW track 48 and one embodiment of the second SAW track 50, respectively. The first SAW track 48 has a first acoustic cavity 110 and the second SAW track 50 has a second acoustic cavity 112, which is divided into a third acoustic cavity 114 and a fourth acoustic cavity 116 by the first interconnecting ground grating 102. The third acoustic cavity 114 and the fourth acoustic cavity 116 are acoustically coupled to one another.

Figure 8:
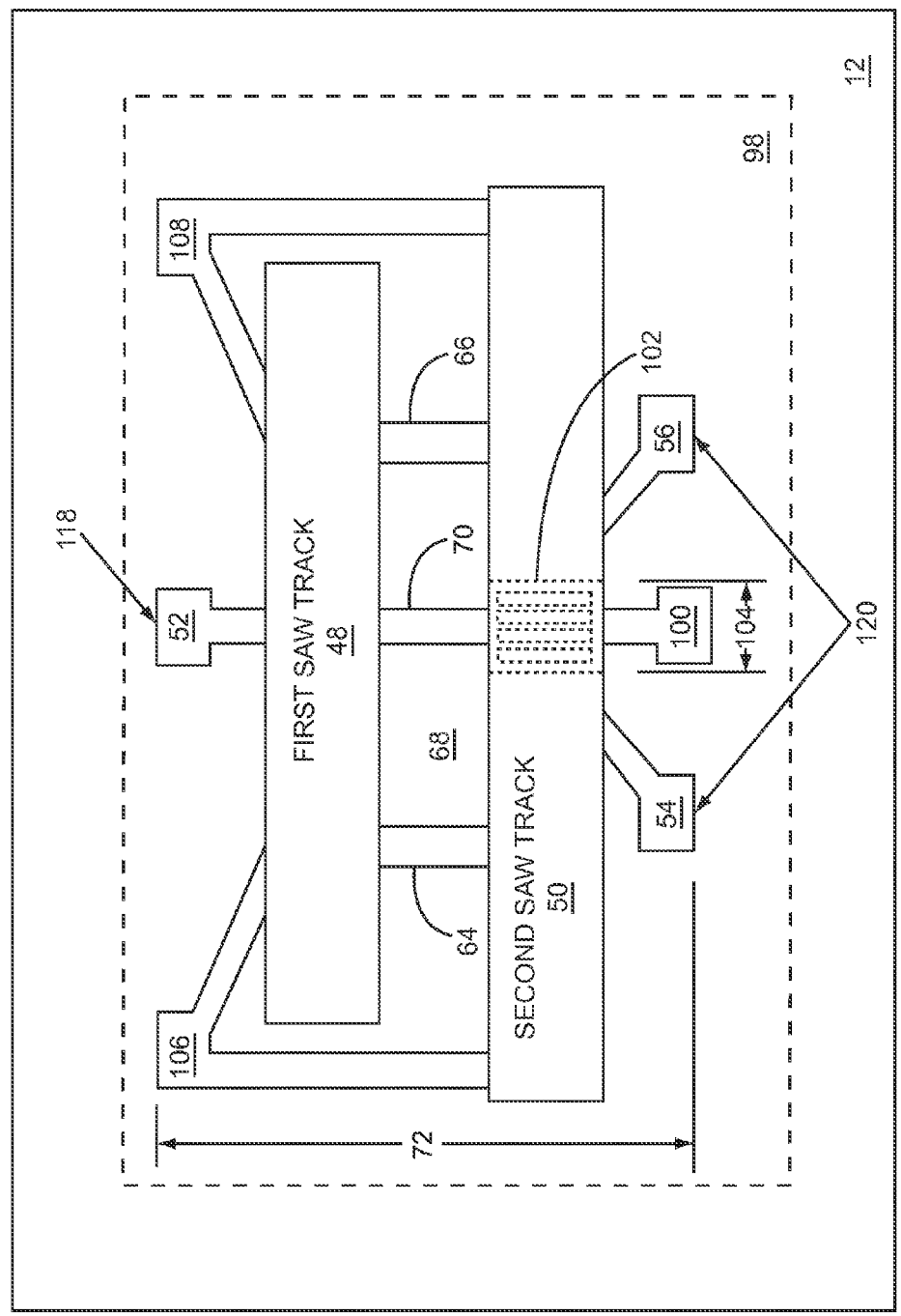
FIG. 8 shows details of the two-track SAW device illustrated in FIG. 6 according to one embodiment of the two-track SAW device.

FIG. 8 shows details of the two-track SAW device 98 illustrated in FIG. 6 according to one embodiment of the two-track SAW device 98. The first connection node 52 provides a single-ended input 118 to the two-track SAW device 98, and the second and the third connection nodes 54, 56 provide a differential output 120 from the two-track SAW device 98.

Figure 9:
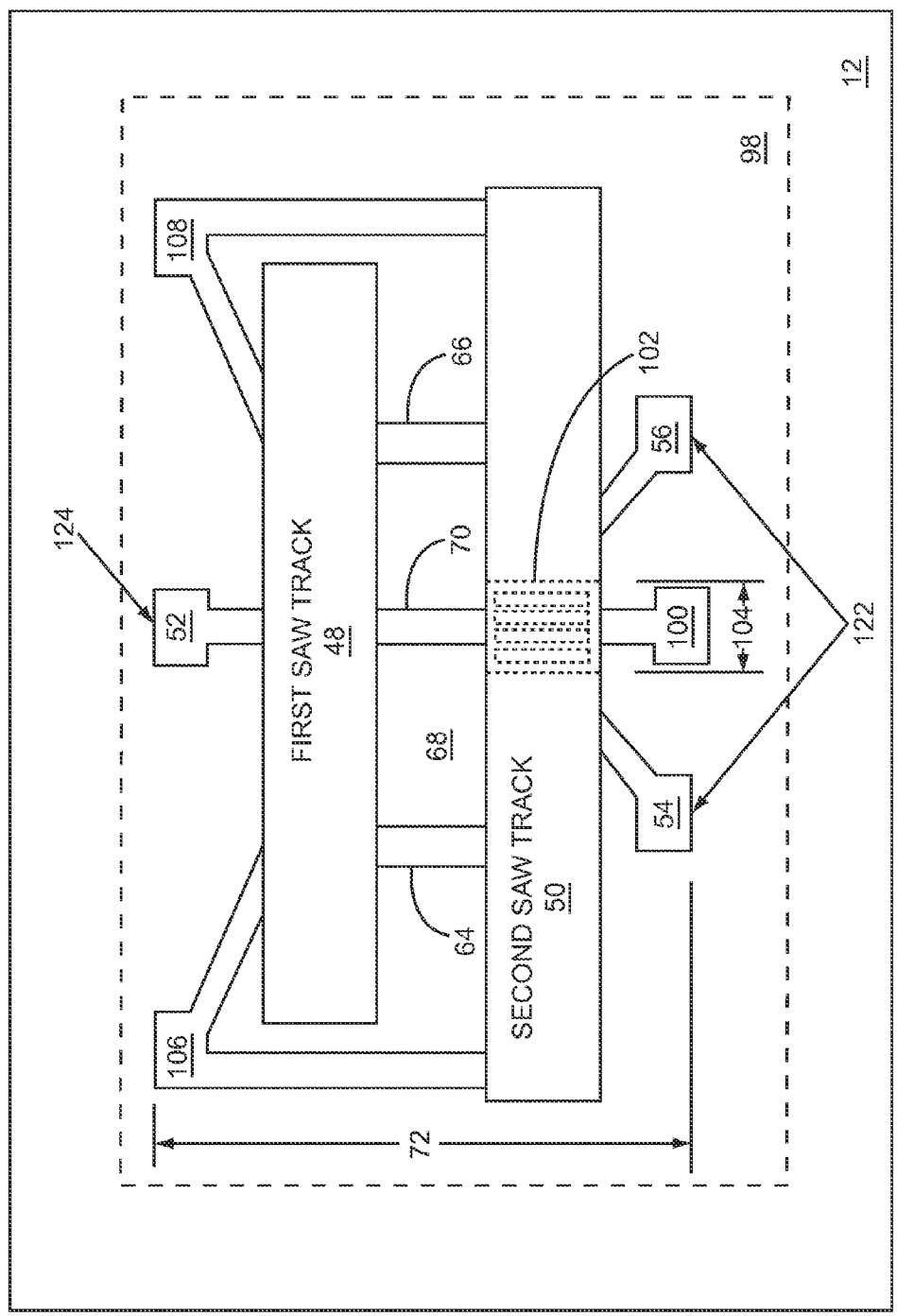
FIG. 9 shows details of the two-track SAW device illustrated in FIG. 6 according to an alternate embodiment of the two-track SAW device.

FIG. 9 shows details of the two-track SAW device 98 illustrated in FIG. 6 according to an alternate embodiment of the two-track SAW device 98. The second and the third connection nodes 54, 56 provide a differential input 122 to the two-track SAW device 98, and the first connection node 52 provides a single-ended output 124 from the two-track SAW device 98.

Figure 10:
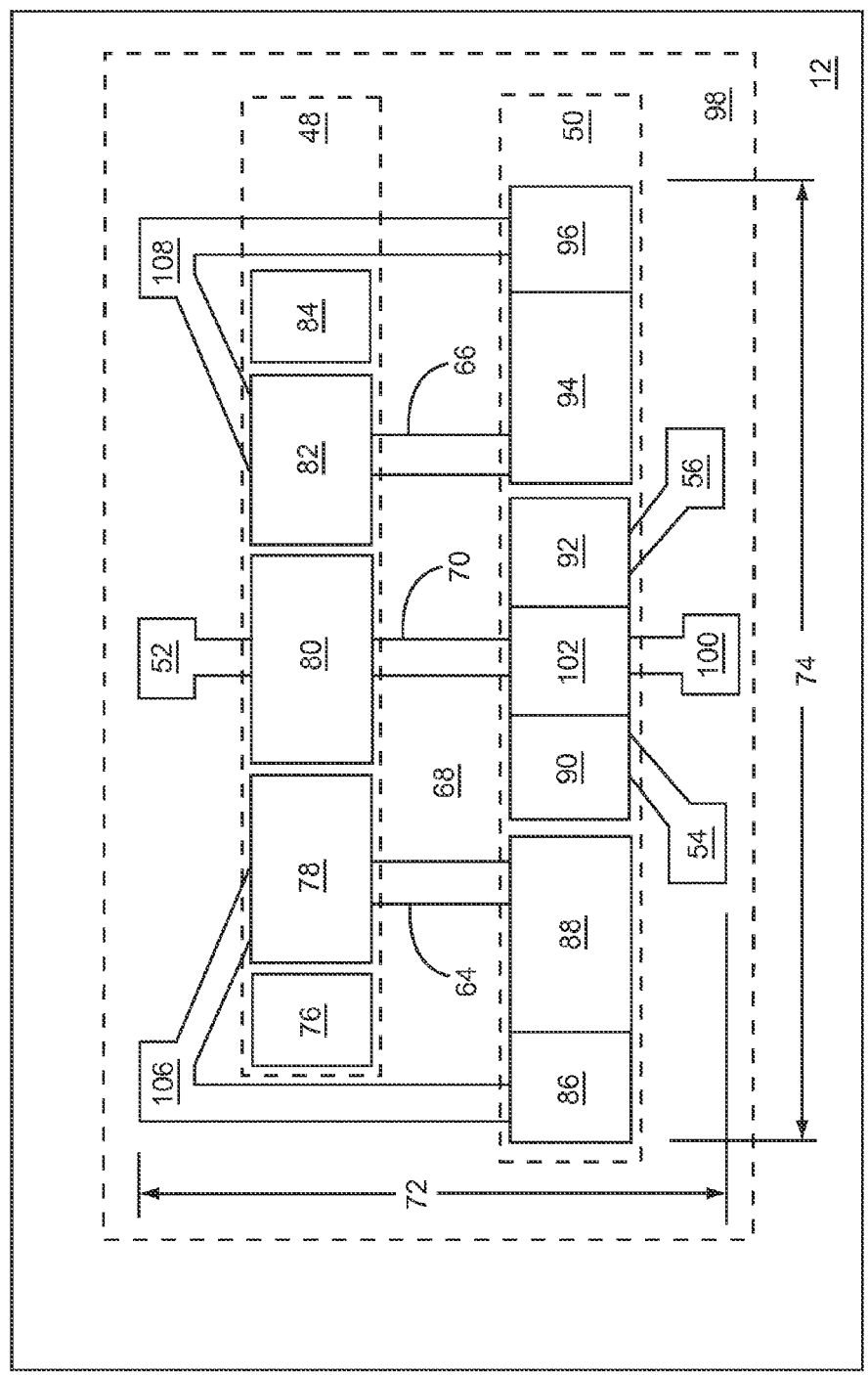
FIG. 10 shows details of the first SAW track and the second SAW track illustrated in FIG. 6 according to an alternate embodiment of the first SAW track and an alternate embodiment of the second SAW track, respectively.

FIG. 10 shows details of the first SAW track 48 and the second SAW track 50 illustrated in FIG. 6 according to an alternate embodiment of the first SAW track 48 and an alternate embodiment of the second SAW track 50, respectively. The first SAW track 48 includes the first grating 76, the first IDT 78 adjacent to the first grating 76, the second IDT 80 adjacent to the first IDT 78, the third IDT 82 adjacent to the second IDT 80, and the second grating 84 adjacent to the third IDT 82. The second SAW track 50 includes the third grating 86, the fourth IDT 88 adjacent to the third grating 86, the fifth IDT 90 adjacent to the fourth IDT 88, the first interconnecting ground grating 102 adjacent to the fifth IDT 90, the sixth IDT 92 adjacent to the first interconnecting ground grating 102, the seventh IDT 94 adjacent to the sixth IDT 92, and the fourth grating 96 adjacent to the seventh IDT 94. The first and the second gratings 76, 84 are floating. The third grating 86 is electrically coupled to the second external ground connection node 106, and the fourth grating 96 is electrically coupled to the third external ground connection node 108. The first SAW track 48 illustrated in FIG. 10 is a three-IDT track and the second SAW track 50 illustrated in FIG. 10 is a four-IDT track.

Grounding IDFs 136 (FIG. 19) of the first IDT 78 may be electrically coupled to the second external ground connection node 106. Active IDFs 134 (FIG. 19) of the first IDT 78 may be electrically coupled to active IDFs 134 (FIG. 19) of the fourth IDT 88 through the first electrical interconnection 64. Grounding IDFs 136 (FIG. 19) of the fourth IDT 88 may be electrically coupled to the second external ground connection node 106 through the third grating 86. Grounding IDFs 136 (FIG. 19) of the second IDT 80 may be electrically coupled to the first external ground connection node 100 through the internal ground interconnection 70 and the first interconnecting ground grating 102. Active IDFs 134 (FIG. 19) of the second IDT 80 may be electrically coupled to the first connection node 52.

Grounding IDFs 136 (FIG. 19) of the third IDT 82 may be electrically coupled to the third external ground connection node 108. Active IDFs 134 (FIG. 19) of the third IDT 82 may be electrically coupled to active IDFs 134 (FIG. 19) of the seventh IDT 94 through the second electrical interconnection 66. Grounding IDFs 136 (FIG. 19) of the seventh IDT 94 may be electrically coupled to the third external ground connection node 108 through the fourth grating 96. Active IDFs 134 (FIG. 19) of the fifth IDT 90 may be electrically coupled to the second connection node 54. Active IDFs 134 (FIG. 19) of the sixth IDT 92 may be electrically coupled to the third connection node 56. Grounding IDFs 136 (FIG. 19) of the fifth IDT 90 may be electrically coupled to the first interconnecting ground grating 102 and grounding IDFs 136 (FIG. 19) of the sixth IDT 92 may be electrically coupled to the first interconnecting ground grating 102.

By including the first interconnecting ground grating 102, the two-track SAW device 98 illustrated in FIG. 10 tends to have a larger SAW device width 74 than the internal ground connection node two-track SAW device 46 illustrated in FIG. 5. However, by electrically coupling the grounding IDFs 136 (FIG. 19) of the third IDT 82 to the fourth grating 96 and by electrically coupling the grounding IDFs 136 (FIG. 19) of the first IDT 78 to the third grating 86, the two-track SAW device 98 illustrated in FIG. 10 tends to have a smaller SAW device width 74 than the internal ground connection node two-track SAW device 46 illustrated in FIG. 5. As a result the SAW device width 74 of the two-track SAW device 98 illustrated in FIG. 10 may be about equal to the SAW device width 74 of the internal ground connection node two-track SAW device 46 illustrated in FIG. 5.

In a first embodiment of the two-track SAW device 98 illustrated in FIG. 10, the first connection node 52 provides the single-ended input 118 (FIG. 8) to the two-track SAW device 98, and the second and the third connection nodes 54, 56 provide the differential output 120 (FIG. 8) from the two-track SAW device 98. When a single-ended alternating current (AC) input signal is applied between the first connection node 52 and the first external ground connection node 100, the second IDT 80 may convert the single-ended AC input signal into surface acoustic waves in the first SAW track 48. The first and the third IDTs 78, 82 may convert the surface acoustic waves in the first SAW track 48 into a first AC signal on the first electrical interconnection 64 and a second AC signal on the second electrical interconnection 66, respectively. The fourth and the seventh IDTs 88, 94 may convert the first and the second AC signals, respectively, into surface acoustic waves in the second SAW track 50. The fifth and the sixth IDTs 90, 92 may convert the surface acoustic waves in the second SAW track 50 into a differential AC output signal on the second and the third connection nodes 54, 56, respectively.

In a second embodiment of the two-track SAW device 98 illustrated in FIG. 10, the second and the third connection nodes 54, 56 provide the differential input 122 (FIG. 9) to the two-track SAW device 98, and the first connection node 52 provides the single-ended output 124 (FIG. 9) from the two-track SAW device 98. When a differential AC input signal is applied between second and the third connection nodes 54, 56, the fifth and the sixth IDTs 90, 92, respectively, may convert the differential AC input signal into surface acoustic waves in the second SAW track 50. The fourth and the seventh IDTs 88, 94 may convert the surface acoustic waves in the second SAW track 50 into first and second AC signals on the first and the second electrical interconnections 64, 66, respectively. The first and the third IDTs 78, 82 may convert the first and the second AC signals, respectively, into surface acoustic waves in the first SAW track 48. The second IDT 80 may convert the surface acoustic waves in the first SAW track 48 into a single-ended AC output signal between the first connection node 52 and the first external ground connection node 100.

Figure 11:
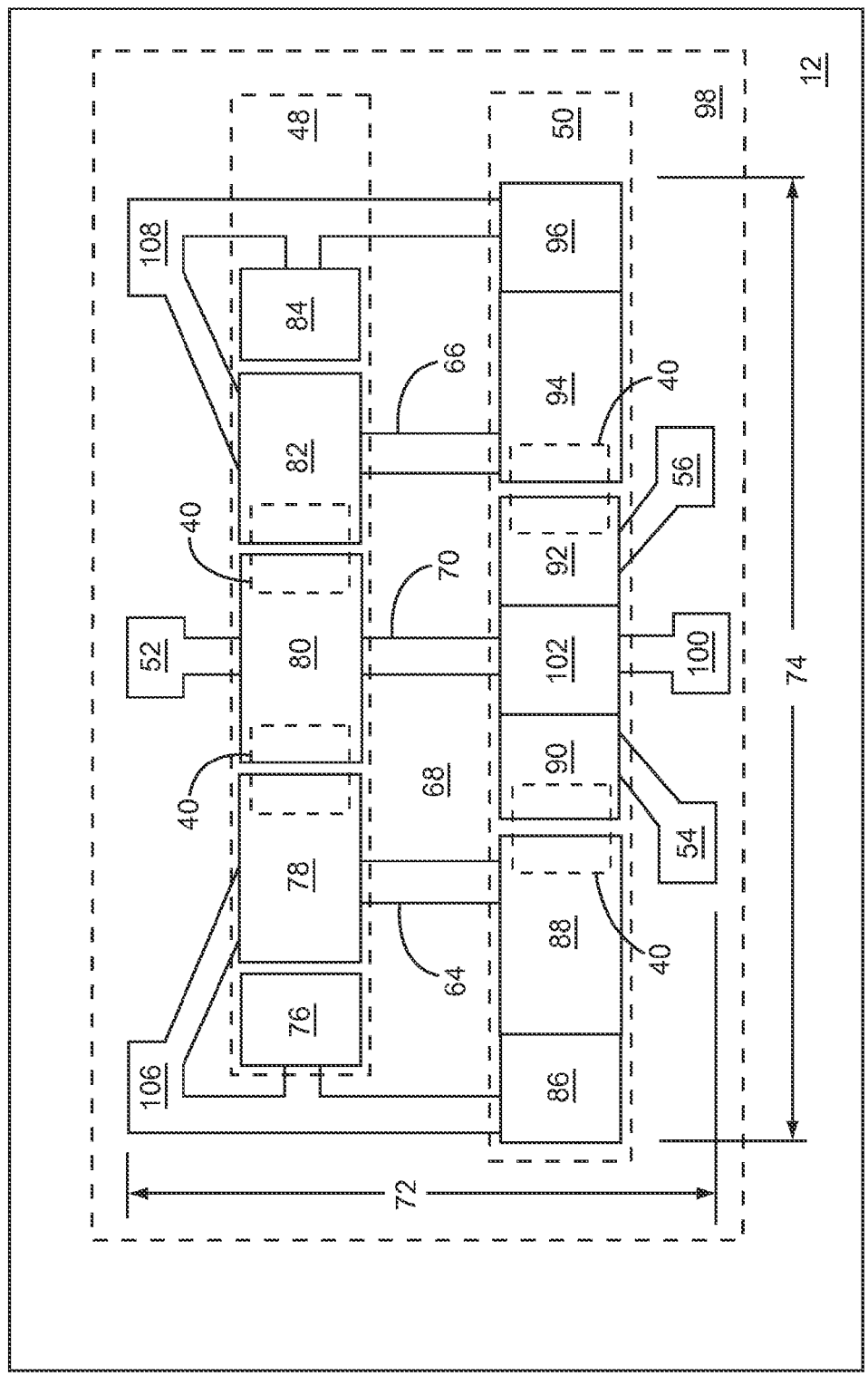
FIG. 11 shows details of the two-track SAW device according to an alternate embodiment of the present disclosure.

FIG. 11 shows details of the two-track SAW device 98 according to an alternate embodiment of the present disclosure. The two-track SAW device 98 illustrated in FIG. 11 is similar to the two-track SAW device 98 illustrated in FIG. 10, except in the two-track SAW device 98 illustrated in FIG. 11, the first grating 76 is electrically coupled to the second external ground connection node 106 and the second grating 84 is electrically coupled to the third external ground connection node 108. The two-track SAW device 98 illustrated in FIG. 11 further includes chirping regions 40 between the first IDT 78 and the second IDT 80, between the second IDT 80 and the third IDT 82, between the fourth IDT 88 and the fifth IDT 90, and between the sixth IDT 92 and the seventh IDT 94 to provide appropriate SAW coupling between the first IDT 78 and the second IDT 80, between the second IDT 80 and the third IDT 82, between the fourth IDT 88 and the fifth IDT 90, and between the sixth IDT 92 and the seventh IDT 94, respectively.

Figure 12:
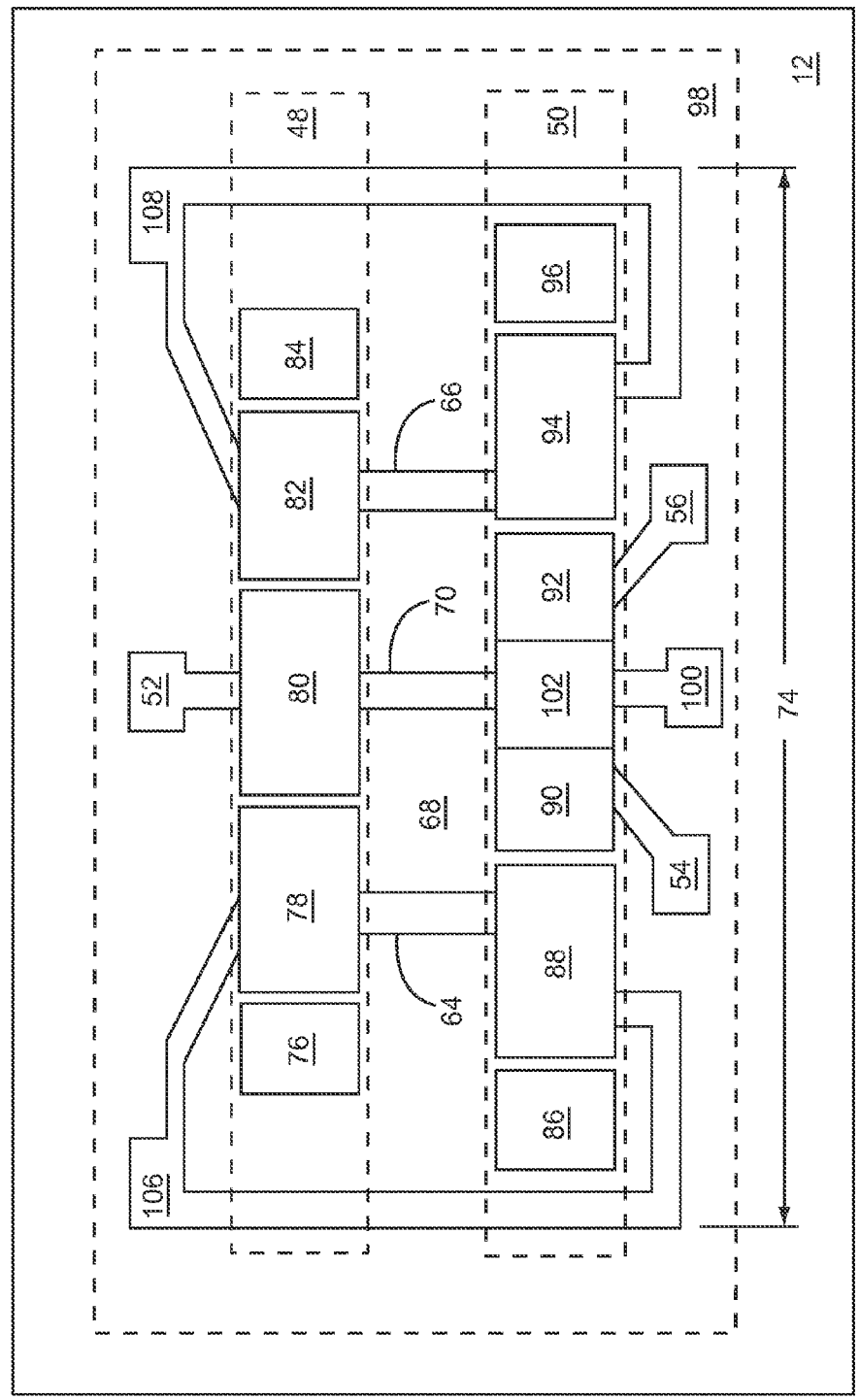
FIG. 12 shows details of the two-track SAW device according to an additional embodiment of the present disclosure.

FIG. 12 shows details of the two-track SAW device 98 according to an additional embodiment of the present disclosure. The two-track SAW device 98 illustrated in FIG. 12 is similar to the two-track SAW device 98 illustrated in FIG. 10, except in the two-track SAW device 98 illustrated in FIG. 12, the third grating 86 and the fourth grating 96 are floating, the grounding IDFs 136 (FIG. 19) of the fourth IDT 88 are not coupled to the third grating 86 but are instead electrically coupled to the second external ground connection node 106, and the grounding IDFs 136 (FIG. 19) of the seventh IDT 94 are not coupled to the fourth grating 96 but are instead electrically coupled to the third external ground connection node 108. As a result, the SAW device width 74 of the two-track SAW device 98 illustrated in FIG. 12 may be larger than the SAW device width 74 of the two-track SAW device 98 illustrated in FIG. 10.

Figure 13:
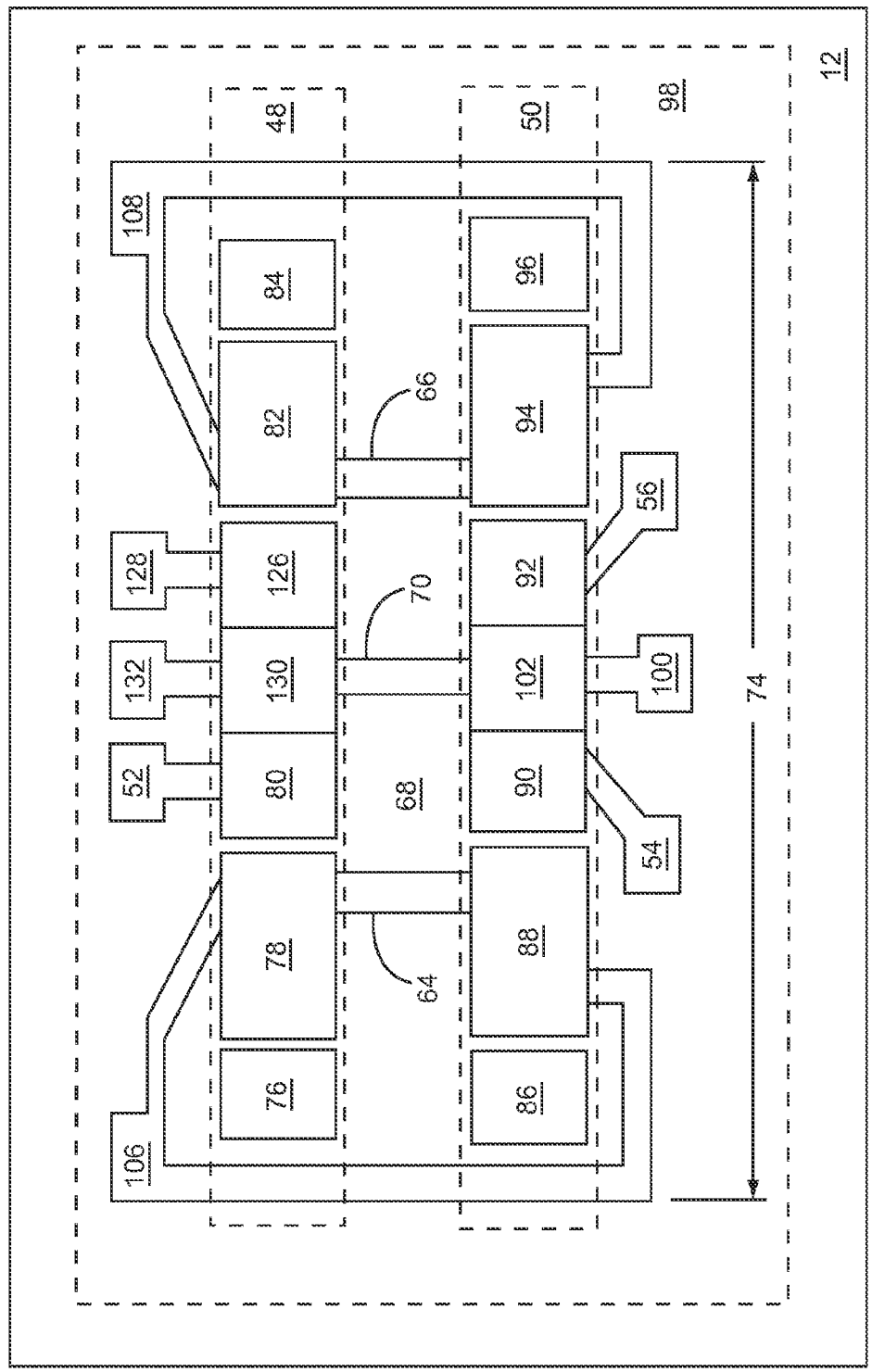
FIG. 13 shows a top-view of the two-track SAW device according to one embodiment of the present disclosure.

FIG. 13 shows a top-view of a two-track SAW device 98 according to one embodiment of the present disclosure. The two-track SAW device 98 illustrated in FIG. 13 is similar to the two-track SAW device 98 illustrated in FIG. 12, except in the two-track SAW device 98 illustrated in FIG. 13, the first SAW track 48 further includes an eighth IDT 126 and the two-track SAW device 98 further includes a fourth connection node 128 disposed on the substrate 12 and electrically coupled to the eighth IDT 126. Additionally, the first SAW track 48 further includes a second interconnecting ground grating 130 and the two-track SAW device 98 further includes a fourth external ground connection node 132 disposed on the substrate 12, such that the fourth external ground connection node 132 is electrically coupled to the internal ground interconnection 70 through the second interconnecting ground grating 130. The second interconnecting ground grating 130 is adjacent to the second IDT 80 and the eighth IDT 126 is adjacent to the second interconnecting ground grating 130 and the third IDT 82. The grounding IDFs 136 (FIG. 19) of the second IDT 80 are electrically coupled to the second interconnecting ground grating 130 and grounding IDFs 136 (FIG. 19) of the eighth IDT 126 are electrically coupled to the second interconnecting ground grating 130. Active IDFs 134 (FIG. 19) of the eighth IDT 126 are electrically coupled to the fourth connection node 128. The first SAW track 48 illustrated in FIG. 13 is a four-IDT track.

Figure 14:
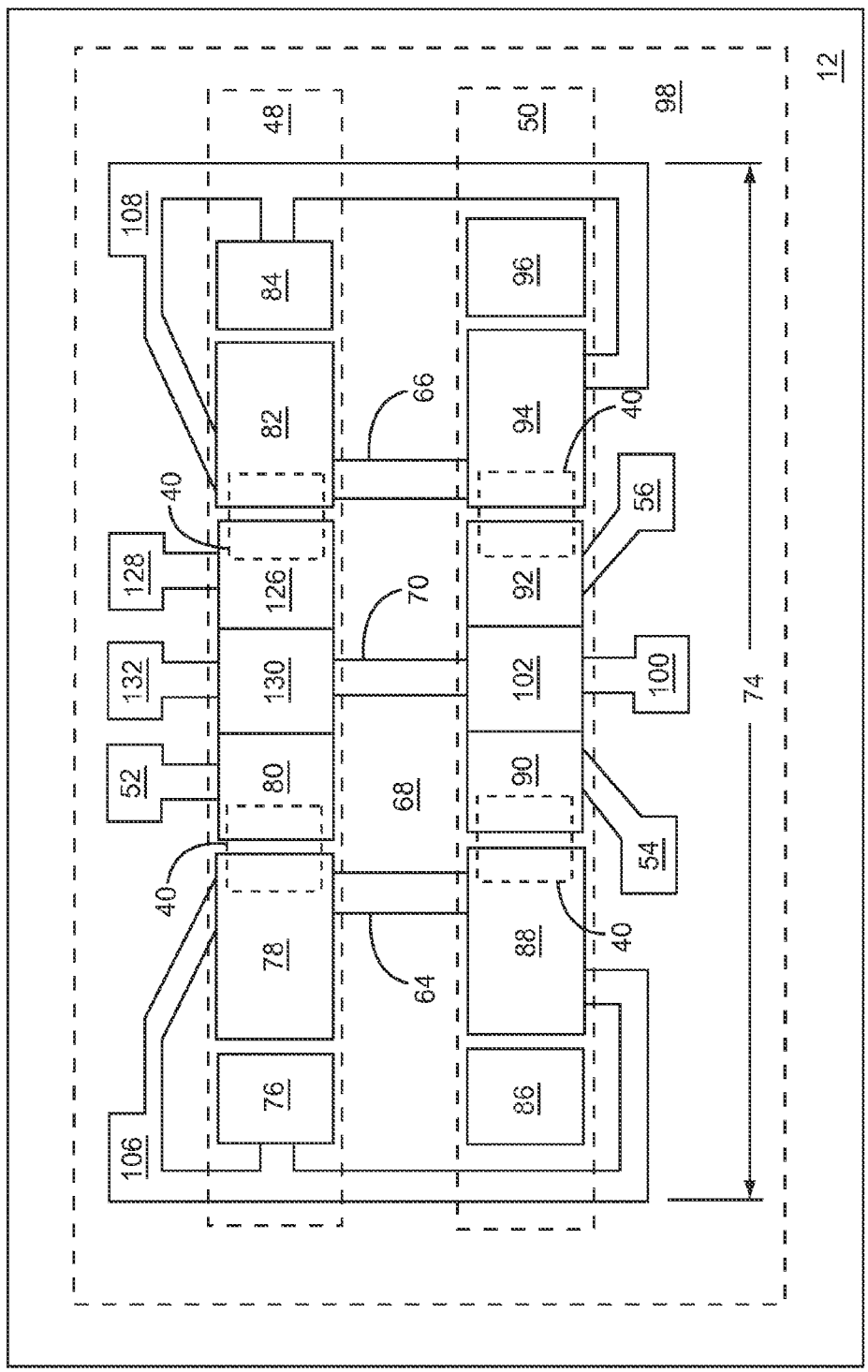
FIG. 14 shows details of the two-track SAW device according to an alternate embodiment of the present disclosure.

FIG. 14 shows details of the two-track SAW device 98 according to an alternate embodiment of the present disclosure. The two-track SAW device 98 illustrated in FIG. 14 is similar to the two-track SAW device 98 illustrated in FIG. 13, except in the two-track SAW device 98 illustrated in FIG. 14, the first grating 76 is electrically coupled to the second external ground connection node 106 and the second grating 84 is electrically coupled to the third external ground connection node 108. The two-track SAW device 98 illustrated in FIG. 14 further includes chirping regions 40 between the first IDT 78 and the second IDT 80, between the eighth IDT 126 and the third IDT 82, between the fourth IDT 88 and the fifth IDT 90, and between the sixth IDT 92 and the seventh IDT 94 to provide appropriate SAW coupling between the first IDT 78 and the second IDT 80, between the eighth IDT 126 and the third IDT 82, between the fourth IDT 88 and the fifth IDT 90, and between the sixth IDT 92 and the seventh IDT 94, respectively.

Figure 15:
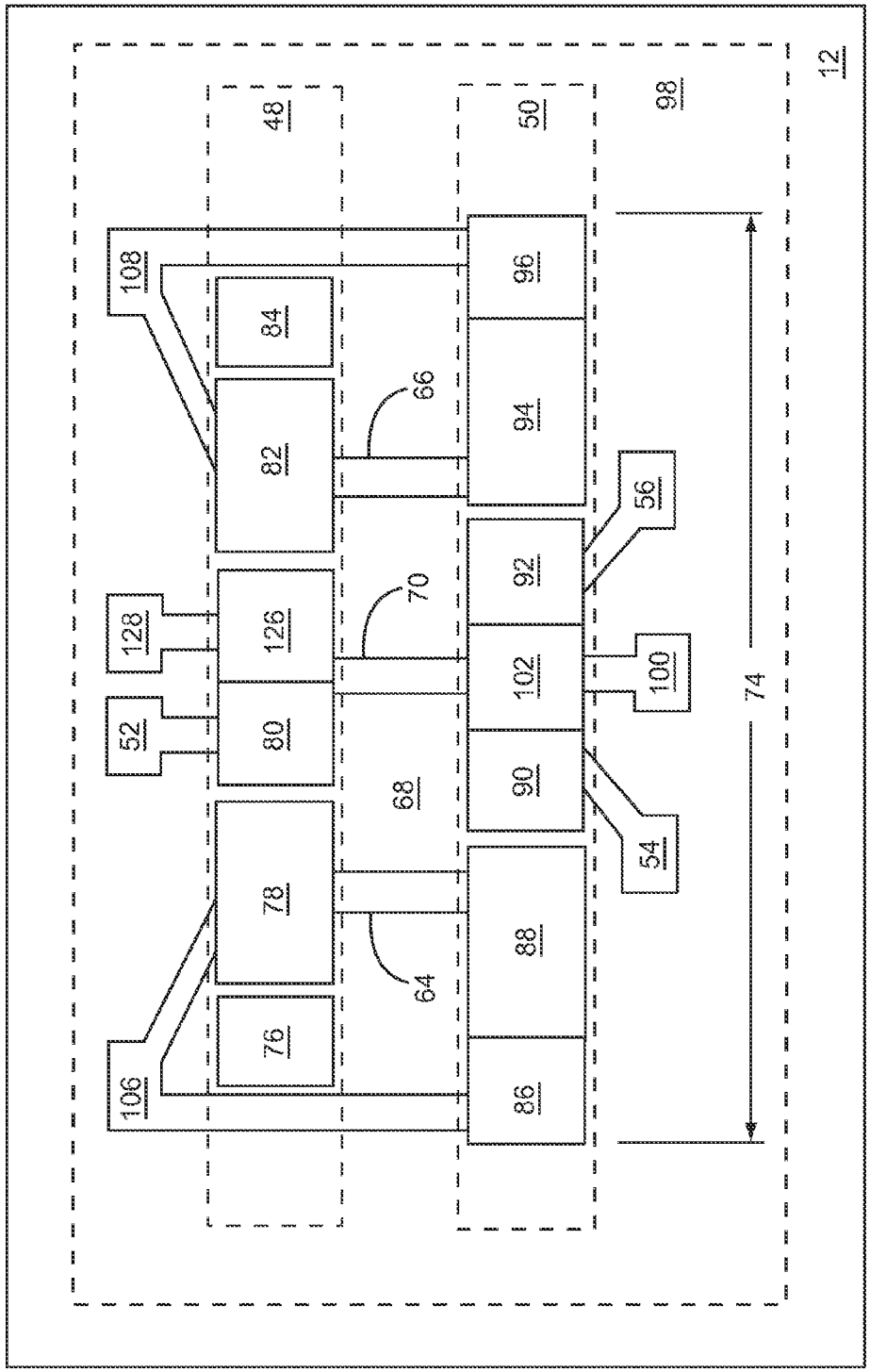
FIG. 15 shows details of the two-track SAW device according to an additional embodiment of the present disclosure.

FIG. 15 shows details of the two-track SAW device 98 according to an additional embodiment of the present disclosure. The two-track SAW device 98 illustrated in FIG. 15 is similar to the two-track SAW device 98 illustrated in FIG. 13, except in the two-track SAW device 98 illustrated in FIG. 15, the third grating 86 is electrically coupled to the second external ground connection node 106, the fourth grating 96 is electrically coupled to the third external ground connection node 108, the grounding IDFs 136 (FIG. 19) of the fourth IDT 88 are electrically coupled to the third grating 86, the grounding IDFs 136 (FIG. 19) of the seventh IDT 94 are electrically coupled to the fourth grating 96, the second interconnecting ground grating 130 is omitted, and the fourth external ground connection node 132 is omitted. The grounding IDFs 136 (FIG. 19) of the second IDT 80 and the eighth IDT 126 are electrically coupled to one another and to the internal ground interconnection 70.

Figure 16:
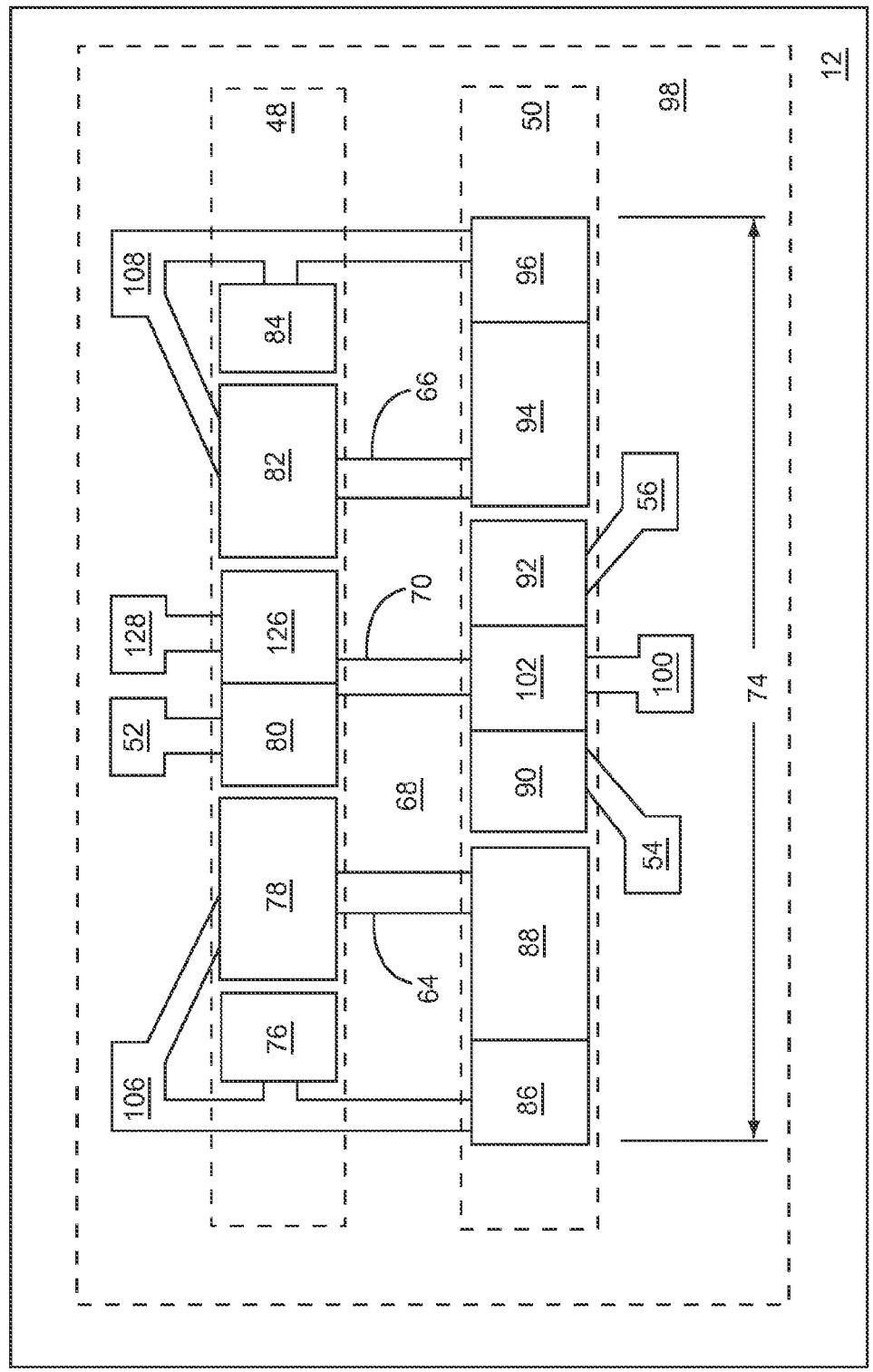
FIG. 16 shows details of the two-track SAW device according to another embodiment of the present disclosure.

FIG. 16 shows details of the two-track SAW device 98 according to another embodiment of the present disclosure. The two-track SAW device 98 illustrated in FIG. 16 is similar to the two-track SAW device 98 illustrated in FIG. 15, except in the two-track SAW device 98 illustrated in FIG. 16, the first grating 76 is electrically coupled to the second external ground connection node 106 and the second grating 84 is electrically coupled to the third external ground connection node 108.

Figure 17:
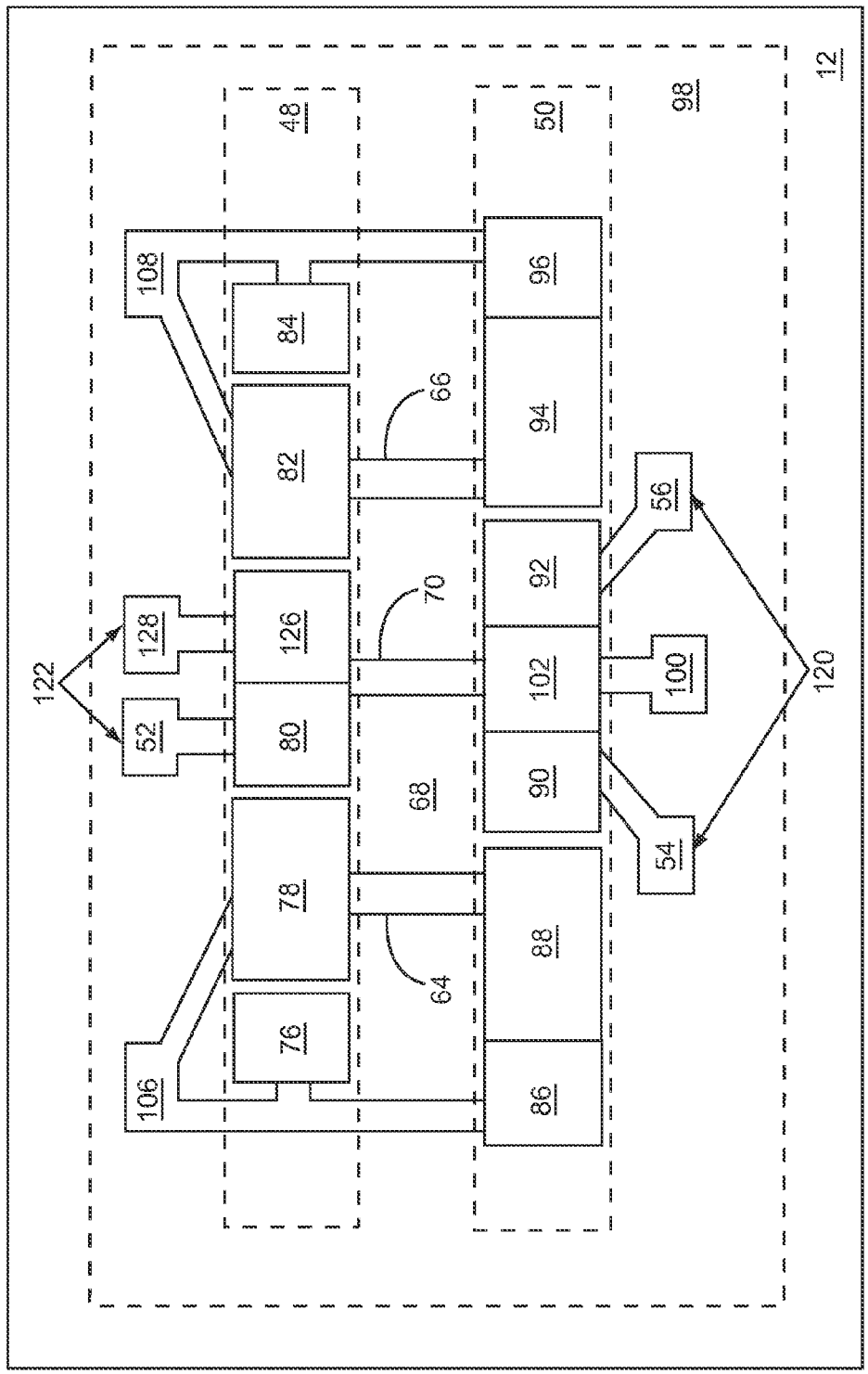
FIG. 17 shows details of the two-track SAW device illustrated in FIG. 16 according to one embodiment of the two-track SAW device.

FIG. 17 shows details of the two-track SAW device 98 illustrated in FIG. 16 according to one embodiment of the two-track SAW device 98. The two-track SAW device 98 illustrated in FIG. 17 is similar to the two-track SAW device 98 illustrated in FIG. 16, except in the two-track SAW device 98 illustrated in FIG. 17, the first connection node 52 and the fourth connection node 128 provide a differential input 122 to the two-track SAW device 98, and the second and the third connection nodes 54, 56 provide a differential output 120 from the two-track SAW device 98.

When a differential AC input signal is applied between the first and the fourth connection nodes 52, 128, the second and the eighth IDTs 80, 126, respectively, may convert the differential AC input signal into surface acoustic waves in the first SAW track 48. The first and the third IDTs 78, 82 may convert the surface acoustic waves in the first SAW track 48 into a first AC signal on the first electrical interconnection 64 and a second AC signal on the second electrical interconnection 66, respectively. The fourth and the seventh IDTs 88, 94 may convert the first and the second AC signals, respectively, into surface acoustic waves in the second SAW track 50. The fifth and the sixth IDTs 90, 92 may convert the surface acoustic waves in the second SAW track 50 into a differential AC output signal on the second and the third connection nodes 54, 56, respectively.

Figure 18:
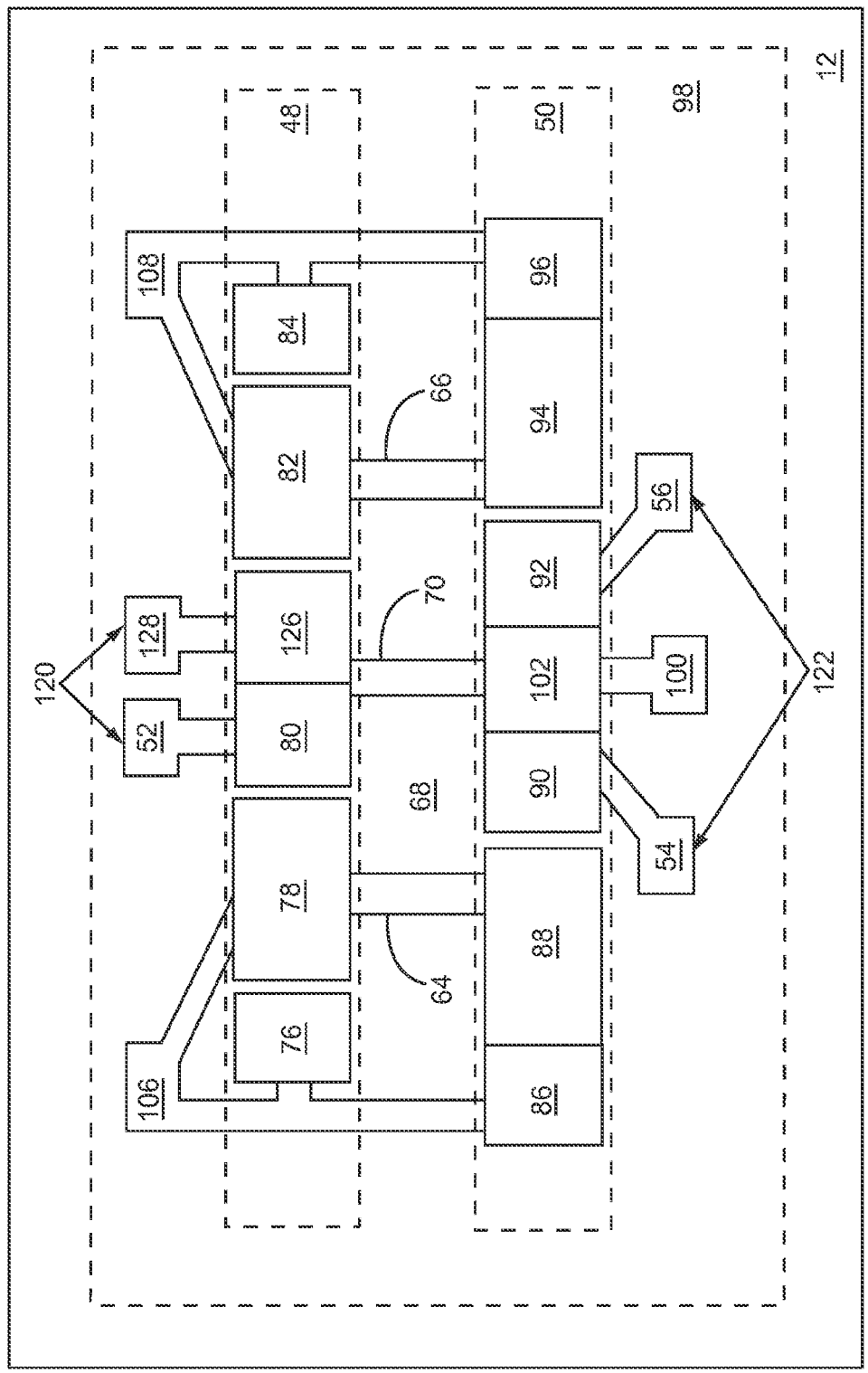
FIG. 18 shows details of the two-track SAW device illustrated in FIG. 16 according to an alternate embodiment of the two-track SAW device.

FIG. 18 shows details of the two-track SAW device 98 illustrated in FIG. 16 according to an alternate embodiment of the two-track SAW device 98. The two-track SAW device 98 illustrated in FIG. 18 is similar to the two-track SAW device 98 illustrated in FIG. 16, except in the two-track SAW device 98 illustrated in FIG. 18, the second and the third connection nodes 54, 56 provide the differential input 122 to the two-track SAW device 98, and the first and the fourth connection nodes 52, 128 provide the differential output 120 from the two-track SAW device 98.

When a differential AC input signal is applied between the second and the third connection nodes 54, 56, the fifth and the sixth IDTs 90, 92, respectively, may convert the differential AC input signal into surface acoustic waves in the second SAW track 50. The fourth and the seventh IDTs 88, 94 may convert the surface acoustic waves in the second SAW track 50 into first and second AC signals on the first and the second electrical interconnections 64, 66, respectively. The first and the third IDTs 78, 82 may convert the first and the second AC signals, respectively, into surface acoustic waves in the first SAW track 48. The second and the eighth IDTs 80, 126 may convert the surface acoustic waves in the first SAW track 48 into a differential AC output signal between the first and the fourth connection nodes 52, 128.

Figure 19:
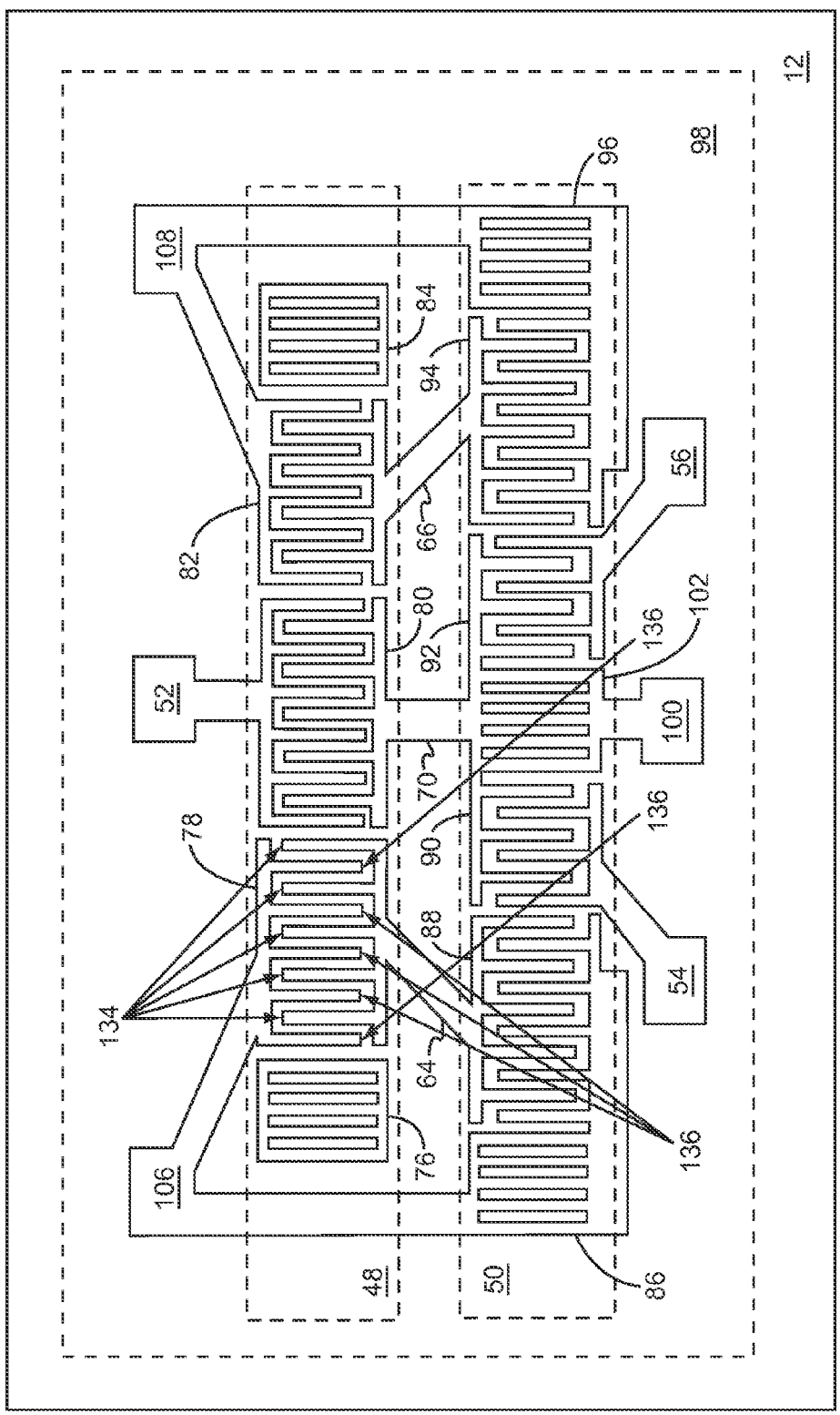
FIG. 19 shows details of the two-track SAW device illustrated in FIG. 10 according to another embodiment of the two-track SAW device.

FIG. 19 shows details of the two-track SAW device 98 illustrated in FIG. 10 according to another embodiment of the two-track SAW device 98. The two-track SAW device 98 illustrated in FIG. 19 shows the active IDFs 134 and the grounding IDFs 136 of the first IDT 78, the second IDT 80, the third IDT 82, the fourth IDT 88, the fifth IDT 90, the sixth IDT 92, and the seventh IDT 94.

Figure 20:
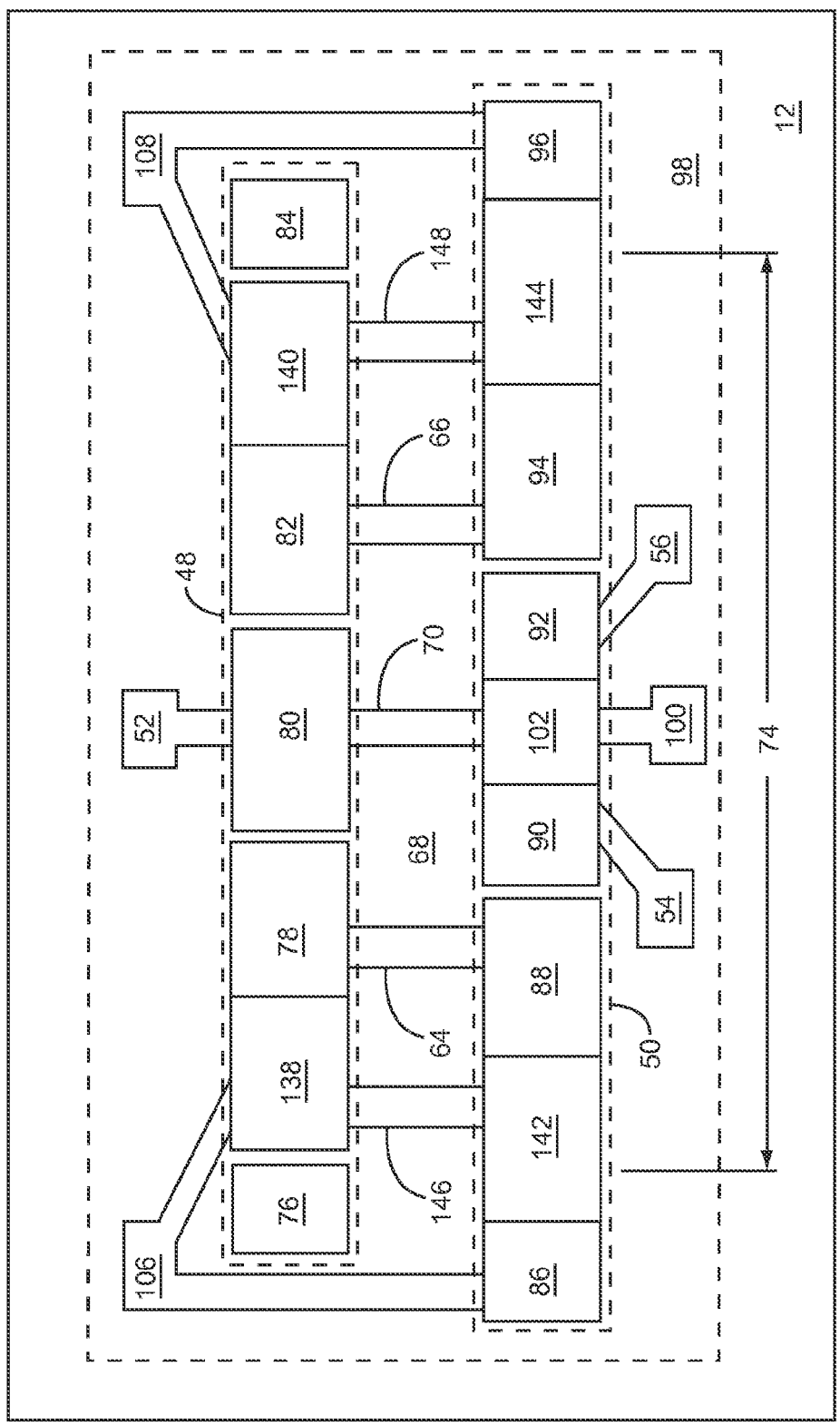
FIG. 20 shows a top-view of a two-track SAW device according to a supplemental embodiment of the present disclosure.

FIG. 20 shows a top-view of a two-track SAW device 98 according to a supplemental embodiment of the present disclosure. In the two-track SAW device 98 illustrated in FIG. 20, the first SAW track 48 includes the first IDT 78, the second IDT 80, the third IDT 82, a ninth IDT 138, and a tenth IDT 140. As such, the first SAW track 48 is a five-IDT track and may function as a multi-mode SAW track. The second SAW track 50 includes the fourth IDT 88, the fifth IDT 90, the sixth IDT 92, the seventh IDT 94, an eleventh IDT 142, a twelfth IDT 144, and the first interconnecting ground grating 102. As such, the second SAW track 50 is a six-IDT track and may function as a multi-mode SAW track. The two-track SAW device 98 includes a third electrical interconnection 146 disposed on the substrate 12 and electrically coupling the ninth IDT 138 to the eleventh IDT 142. The two-track SAW device 98 further includes a fourth electrical interconnection 148 disposed on the substrate 12 and electrically coupling the tenth IDT 140 to the twelfth IDT 144. The fourth IDT 88, the fifth IDT 90, and the eleventh IDT 142 are on one side of the first interconnecting ground grating 102 and the sixth IDT 92, the seventh IDT 94, and the twelfth IDT 144 are on the other side of the first interconnecting ground grating 102. In general, the second SAW track 50 typically has an even number of IDTs, which may be divided into two groups of equal quantity. The first interconnecting ground grating 102 is located between the two groups of IDTs.

Figure 21:
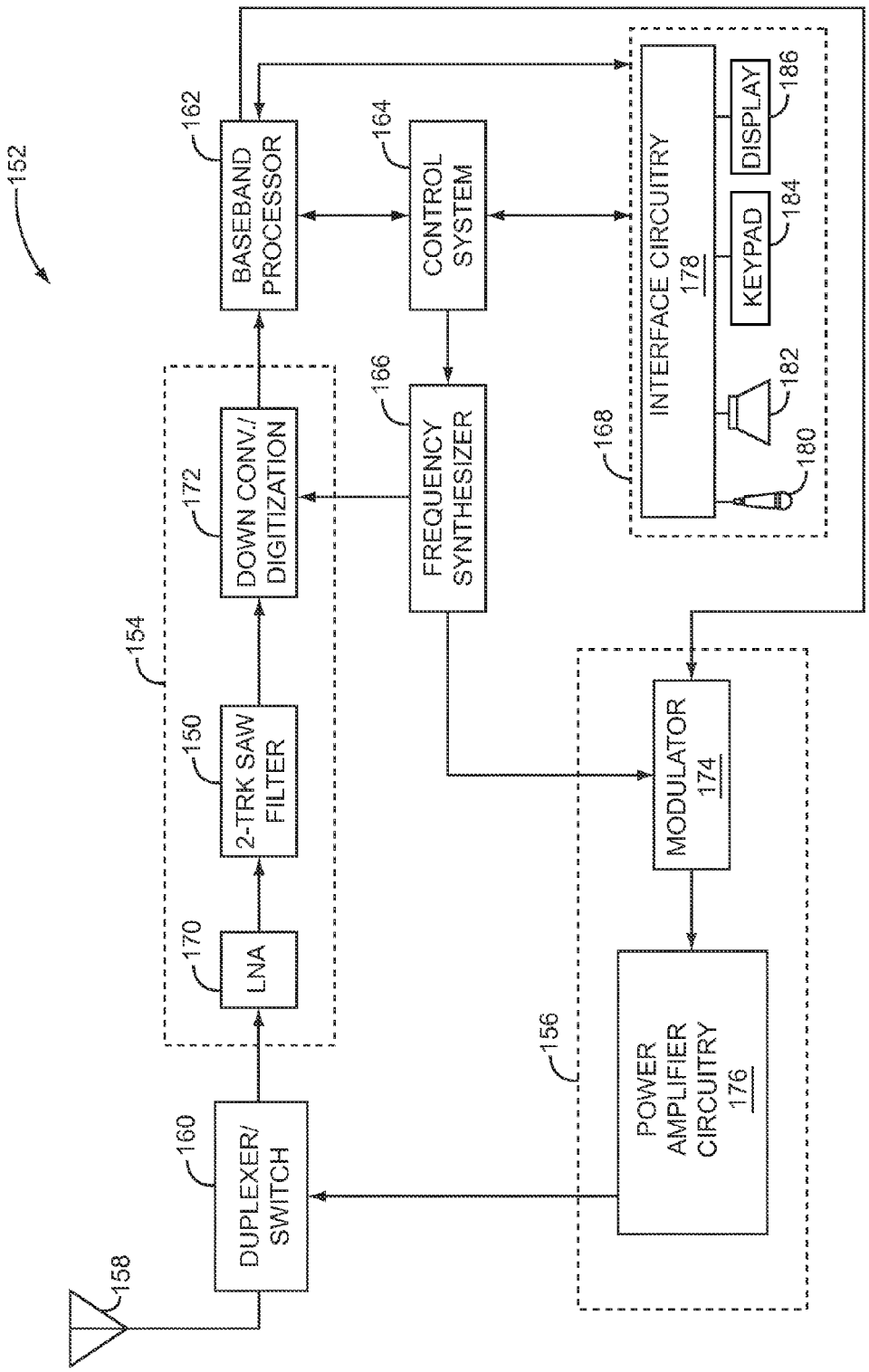
FIG. 21 shows an application example of the present disclosure used in a mobile terminal.

An application example of two-track SAW device 98 is its use as a two-track SAW filter 150 in a mobile terminal 152, the basic architecture of which is represented in FIG. 21. The mobile terminal 152 may include a receiver front end 154, a radio frequency transmitter section 156, an antenna 158, a duplexer or switch 160, a baseband processor 162, a control system 164, a frequency synthesizer 166, and an interface 168. The receiver front end 154 receives information bearing radio frequency signals from one or more remote transmitters provided by a base station (not shown). A low noise amplifier (LNA) 170 amplifies the signal. The two-track SAW filter 150 minimizes broadband interference in the received signal, while down conversion and digitization circuitry 172 down converts the filtered, received signal to an intermediate or baseband frequency signal, which is then digitized into one or more digital streams. The receiver front end 154 typically uses one or more mixing frequencies generated by the frequency synthesizer 166. The baseband processor 162 processes the digitized received signal to extract the information or data bits conveyed in the received signal. This processing typically comprises demodulation, decoding, and error correction operations. As such, the baseband processor 162 is generally implemented in one or more digital signal processors (DSPs).

On the transmit side, the baseband processor 162 receives digitized data, which may represent voice, data, or control information, from the control system 164, which it encodes for transmission. The encoded data is output to the transmitter 156, where it is used by a modulator 174 to modulate a carrier signal that is at a desired transmit frequency. Power amplifier circuitry 176 amplifies the modulated carrier signal to a level appropriate for transmission, and delivers the amplified and modulated carrier signal to the antenna 158 through the duplexer or switch 160.

A user may interact with the mobile terminal 152 via the interface 168, which may include interface circuitry 178 associated with a microphone 180, a speaker 182, a keypad 184, and a display 186. The interface circuitry 178 typically includes analog-to-digital converters, digital-to-analog converters, amplifiers, and the like. Additionally, it may include a voice encoder/decoder, in which case it may communicate directly with the baseband processor 162. The microphone 180 will typically convert audio input, such as the user's voice, into an electrical signal, which is then digitized and passed directly or indirectly to the baseband processor 162. Audio information encoded in the received signal is recovered by the baseband processor 162, and converted by the interface circuitry 178 into an analog signal suitable for driving the speaker 182. The keypad 184 and display 186 enable the user to interact with the mobile terminal 152, input numbers to be dialed, address book information, or the like, as well as monitor call progress information.

Some of the circuitry previously described may use discrete circuitry, integrated circuitry, programmable circuitry, non-volatile circuitry, volatile circuitry, software executing instructions on computing hardware, firmware executing instructions on computing hardware, the like, or any combination thereof. The computing hardware may include mainframes, micro-processors, micro-controllers, DSPs, the like, or any combination thereof.

None of the embodiments of the present disclosure are intended to limit the scope of any other embodiment of the present disclosure. Any or all of any embodiment of the present disclosure may be combined with any or all of any other embodiment of the present disclosure to create new embodiments of the present disclosure. Any two elements that are coupled to one another may be connected to one another in alternate embodiments of the present disclosure.

Those skilled in the art will recognize improvements and modifications to the preferred embodiments of the present disclosure. All such improvements and modifications are considered within the scope of the concepts disclosed herein and the claims that follow.

What is claimed is:

1. A two-track surface acoustic wave (SAW) device comprising:
   a substrate;
   a first SAW track disposed on the substrate;
   a second SAW track disposed on the substrate and comprising a first interconnecting ground grating;
   a first electrical interconnection disposed on the substrate electrically connecting the first SAW track to the second SAW track;
   a second electrical interconnection disposed on the substrate electrically connecting the first SAW track to the second SAW track;
   an internal region defined by the first SAW track, the second SAW track, the first electrical interconnection, and the second electrical interconnection;
   an internal ground interconnection disposed on the substrate in the internal region; and
   a first external ground connection node disposed on the substrate outside of the internal region and electrically coupled to the internal ground interconnection through the first interconnecting ground grating.

2. The two-track SAW device of claim 1 wherein the first external ground connection node is electrically connected to the internal ground interconnection through the first interconnecting ground grating.

3. The two-track SAW device of claim 1 wherein the second SAW track further comprises a first plurality of inter-digital transducers (IDTs) and a second plurality of IDTs, such that the first interconnecting ground grating is between the first plurality of IDTs and the second plurality of IDTs, and a quantity of IDTs in the first plurality of IDTs is equal to a quantity of IDTs in the second plurality of IDTs.

4. The two-track SAW device of claim 1 wherein the internal region comprises no ground connection nodes.

5. The two-track SAW device of claim 1 wherein the first SAW track has a first acoustic cavity and the second SAW track has a second acoustic cavity, which is divided into two acoustic cavities by the first interconnecting ground grating, such that the two acoustic cavities are acoustically coupled to one another.

6. The two-track SAW device of claim 1 wherein a length of the first interconnecting ground grating is greater than one wavelength of a surface acoustic wave of the two-track SAW device.

7. The two-track SAW device of claim 1 wherein:
   the first SAW track comprises:
      a first plurality of inter-digital transducers (IDTs) comprising a first of the first plurality of IDTs, a second of the first plurality of IDTs, and a third of the first plurality of IDTs;
      a first grating; and
      a second grating; and
   the second SAW track comprises:
      a second plurality of IDTs comprising a first of the second plurality of IDTs, a second of the second plurality of IDTs, a third of the second plurality of IDTs, and a fourth of the second plurality of IDTs;
      a third grating; and
      a fourth grating.

8. The two-track SAW device of claim 7 further comprising:
   a second external ground connection node disposed on the substrate outside of the internal region;
   a third external ground connection node disposed on the substrate outside of the internal region;
   a first connection node disposed on the substrate;
   a second connection node disposed on the substrate; and
   a third connection node disposed on the substrate, such that:
      each of the first plurality of IDTs comprises an active set of inter-digitated fingers (IDFs) and a grounding set of IDFs, such that:
         the grounding set of IDFs of the first of the first plurality of IDTs is electrically coupled to the second external ground connection node;
         the active set of IDFs of the first of the first plurality of IDTs is electrically coupled to the first electrical interconnection;

the grounding set of IDFs of the second of the first plurality of IDTs is electrically coupled to the internal ground interconnection;

the active set of IDFs of the second of the first plurality of IDTs is electrically coupled to the first connection node;

the grounding set of IDFs of the third of the first plurality of IDTs is electrically coupled to the third external ground connection node; and the active set of IDFs of the third of the first plurality of IDTs is electrically coupled to the second electrical interconnection; and each of the second plurality of IDTs comprises an active set of IDFs and a grounding set of IDFs, such that:

the grounding set of IDFs of the first of the second plurality of IDTs is electrically coupled to the second external ground connection node;

the active set of IDFs of the first of the second plurality of IDTs is electrically coupled to the first electrical interconnection;

the grounding set of IDFs of the second of the second plurality of IDTs is electrically coupled to the internal ground interconnection;

the active set of IDFs of the second of the second plurality of IDTs is electrically coupled to the second connection node;

the grounding set of IDFs of the third of the second plurality of IDTs is electrically coupled to the internal ground interconnection;

the active set of IDFs of the third of the second plurality of IDTs is electrically coupled to the third connection node;

the grounding set of IDFs of the fourth of the second plurality of IDTs is electrically coupled to the third external ground connection node; and the active set of IDFs of the fourth of the second plurality of IDTs is electrically coupled to the second electrical interconnection.

9. The two-track SAW device of claim 8 wherein:
the third grating is electrically coupled to the second external ground connection node; and
the fourth grating is electrically coupled to the third external ground connection node.

10. The two-track SAW device of claim 9 wherein:
the first grating is electrically coupled to the second external ground connection node; and
the second grating is electrically coupled to the third external ground connection node.

11. The two-track SAW device of claim 8 wherein:
the first connection node provides a single-ended input to the two-track SAW device; and
the second connection node and the third connection node provide a differential output from the two-track SAW device.

12. The two-track SAW device of claim 8 wherein:
the first connection node provides a single-ended output from the two-track SAW device; and
the second connection node and the third connection node provide a differential input to the two-track SAW device.

13. The two-track SAW device of claim 7 wherein:
the first plurality of IDTs further comprises at least five IDTs; and
the second plurality of IDTs further comprises at least six IDTs.

14. The two-track SAW device of claim 13 wherein the two-track SAW device is a multi-mode two-track SAW device.

15. The two-track SAW device of claim 7 further comprising:
a first chirping region between the first of the first plurality of IDTs and the second of the first plurality of IDTs;
a second chirping region between the second of the first plurality of IDTs and the third of the first plurality of IDTs;
a third chirping region between the first of the second plurality of IDTs and the second of the second plurality of IDTs; and
a fourth chirping region between the third of the second plurality of IDTs and the fourth of the second plurality of IDTs.

16. The two-track SAW device of claim 1 wherein the two-track SAW device is a dual-mode two-track SAW device.

17. The two-track SAW device of claim 1 wherein the two-track SAW device is a two-track SAW filter.

18. The two-track SAW device of claim 1 wherein:
the first SAW track comprises:
a first plurality of inter-digital transducers (IDTs) comprising a first of the first plurality of IDTs, a second of the first plurality of IDTs, a third of the first plurality of IDTs, and a fourth of the first plurality of IDTs;
a first grating; and
a second grating; and
the second SAW track comprises:
a second plurality of IDTs comprising a first of the second plurality of IDTs, a second of the second plurality of IDTs, a third of the second plurality of IDTs, and a fourth of the second plurality of IDTs;
a third grating; and
a fourth grating.

19. The two-track SAW device of claim 18 further comprising:
a second external ground connection node disposed on the substrate outside of the internal region;
a third external ground connection node disposed on the substrate outside of the internal region;
a first connection node disposed on the substrate;
a second connection node disposed on the substrate;
a third connection node disposed on the substrate; and
a fourth connection node disposed on the substrate, such that:
each of the first plurality of IDTs comprises an active set of inter-digitated fingers (IDFs) and a grounding set of IDFs, such that:
the grounding set of IDFs of the first of the first plurality of IDTs is electrically coupled to the second external ground connection node;
the active set of IDFs of the first of the first plurality of IDTs is electrically coupled to the first electrical interconnection;
the grounding set of IDFs of the second of the first plurality of IDTs is electrically coupled to the internal ground interconnection;
the active set of IDFs of the second of the first plurality of IDTs is electrically coupled to the first connection node;
the grounding set of IDFs of the third of the first plurality of IDTs is electrically coupled to the internal ground interconnection;
the active set of IDFs of the third of the first plurality of IDTs is electrically coupled to the fourth connection node;
the grounding set of IDFs of the fourth of the first plurality of IDTs is electrically coupled to the third external ground connection node; and the active set of IDFs of the fourth of the first plurality of IDTs is electrically coupled to the second electrical interconnection; and each of the second plurality of IDTs comprises an active set of IDFs and a grounding set of IDFs, such that:

the grounding set of IDFs of the first of the second plurality of IDTs is electrically coupled to the second external ground connection node;

the active set of IDFs of the first of the second plurality of IDTs is electrically coupled to the first electrical interconnection;

the grounding set of IDFs of the second of the second plurality of IDTs is electrically coupled to the internal ground interconnection;

the active set of IDFs of the second of the second plurality of IDTs is electrically coupled to the second connection node;

the grounding set of IDFs of the third of the second plurality of IDTs is electrically coupled to the internal ground interconnection;

the active set of IDFs of the third of the second plurality of IDTs is electrically coupled to the third connection node;

the grounding set of IDFs of the fourth of the second plurality of IDTs is electrically coupled to the third external ground connection node; and the active set of IDFs of the fourth of the second plurality of IDTs is electrically coupled to the second electrical interconnection.

20. The two-track SAW device of claim 19 wherein:

the third grating is electrically coupled to the second external ground connection node; and the fourth grating is electrically coupled to the third external ground connection node.

21. The two-track SAW device of claim 20 wherein:

the first grating is electrically coupled to the second external ground connection node; and the second grating is electrically coupled to the third external ground connection node.

22. The two-track SAW device of claim 19 further comprising a fourth external ground connection node disposed on the substrate outside of the internal region and electrically coupled to the internal ground interconnection through a second interconnecting ground grating, such that the first SAW track further comprises the second interconnecting ground grating.

23. The two-track SAW device of claim 19 wherein:

the first connection node and the fourth connection node provide a differential input to the two-track SAW device; and the second connection node and the third connection node provide a differential output from the two-track SAW device.

24. The two-track SAW device of claim 19 wherein:

the first connection node and the fourth connection node provide a differential output from the two-track SAW device; and the second connection node and the third connection node provide a differential input to the two-track SAW device.

25. The two-track SAW device of claim 18 further comprising:

a first chirping region between the first of the first plurality of IDTs and the second of the first plurality of IDTs;

a second chirping region between the third of the first plurality of IDTs and the fourth of the first plurality of IDTs;

a third chirping region between the first of the second plurality of IDTs and the second of the second plurality of IDTs; and a fourth chirping region between the third of the second plurality of IDTs and the fourth of the second plurality of IDTs.

26. A method for forming a two-track surface acoustic wave (SAW) device comprising:

disposing a first SAW track on a substrate;

disposing a second SAW track on the substrate, such that the second SAW track comprises a first interconnecting ground grating;

disposing a first electrical interconnection on the substrate, such that the first electrical interconnection electrically connects the first SAW track to the second SAW track;

disposing a second electrical interconnection on the substrate, such that the second electrical interconnection further electrically connects the first SAW track to the second SAW track;

providing an internal region defined by the first SAW track, the second SAW track, the first electrical interconnection, and the second electrical interconnection;

disposing an internal ground interconnection on the substrate in the internal region; and disposing a first external ground connection node on the substrate, such that the first external ground connection node is electrically coupled to the internal ground interconnection through the first interconnecting ground grating.

\* \* \* \* \*